US008835938B2

(12) United States Patent
Hata

(10) Patent No.: US 8,835,938 B2
(45) Date of Patent: Sep. 16, 2014

(54) NITRIDE SEMICONDUCTOR LIGHT-EMITTING ELEMENT AND METHOD OF MANUFACTURING THE SAME

(75) Inventor: Toshio Hata, Mihara (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 382 days.

(21) Appl. No.: 11/892,935

(22) Filed: Aug. 28, 2007

(65) Prior Publication Data

US 2008/0061315 A1    Mar. 13, 2008

(30) Foreign Application Priority Data

Sep. 8, 2006  (JP) ................................ 2006-244195
May 31, 2007 (JP) ................................ 2007-145584

(51) Int. Cl.
*H01L 33/00*    (2010.01)
*H01L 21/302*   (2006.01)

(52) U.S. Cl.
USPC ................. 257/79; 257/13; 257/81; 257/189; 257/E33.025; 257/E33.073; 438/665; 438/666; 438/689; 438/690

(58) Field of Classification Search
CPC ..... H01L 33/00; H01L 33/005; H01L 33/007; H01L 33/0079; H01L 2224/03001; H01L 2224/80006
USPC ....................... 257/79, 95, E33.001, E33.015, 257/E31.099, E25.01, 90, 91, 13, 103, 12, 257/14, 15, 81, 82, 88, 94, 96, 99, 183, 189, 257/201, 745, E33.002, E33.008, E33.023, 257/E33.025, E33.026, E33.027, E33.028, 257/E33.03, E33.031, E33.032, E33.033, 257/E33.034, E33.049, E33.073; 438/663, 438/665, 666, 689, 690
See application file for complete search history.

(56) References Cited

U.S. PATENT DOCUMENTS 4,605,942 A    8/1986  Camlibel et al.
4,987,460 A *  1/1991  Takasu et al. ................. 257/103

(Continued)

FOREIGN PATENT DOCUMENTS

CN    1368764    9/2002
CN    1407637    4/2003

(Continued)

OTHER PUBLICATIONS

Gordon. Criteria for Chooing Transparenet Conductors. MRS Bulletin. Aug. 2000, pp. 52-57.*

(Continued)

*Primary Examiner* — Cuong Q Nguyen
*Assistant Examiner* — Galina Yushina
(74) *Attorney, Agent, or Firm* — Morrison & Foerster LLP

(57) ABSTRACT

There is provided a nitride semiconductor light-emitting element including a transparent conductor, a first conductivity-type nitride semiconductor layer, a light-emitting layer, and a second conductivity-type nitride semiconductor layer, the first conductivity-type nitride semiconductor layer, the light-emitting layer, and the second conductivity-type nitride semiconductor layer being successively stacked on the transparent conductor. There is also provided a nitride semiconductor light-emitting element including a first transparent conductor, a metal layer, a second transparent conductor, a first conductivity-type nitride semiconductor layer, a light-emitting layer, and a second conductivity-type nitride semiconductor layer, the metal layer, the second transparent conductor, the first conductivity-type nitride semiconductor layer, the light-emitting layer, and the second conductivity-type nitride semiconductor layer being successively stacked on the first transparent conductor. There is also provided a method of manufacturing each of these nitride semiconductor light-emitting elements.

17 Claims, 16 Drawing Sheets

(56) References Cited

U.S. PATENT DOCUMENTS

| | | | |
|---|---|---|---|
| 6,169,294 B1 | 1/2001 | Biing-Jye et al. | |
| 6,177,352 B1 | 1/2001 | Schonfeld et al. | |
| 6,197,609 B1 | 3/2001 | Tsutsui | |
| 6,201,264 B1 | 3/2001 | Khare | |
| 6,320,206 B1 | 11/2001 | Coman | |
| 6,441,403 B1* | 8/2002 | Chang et al. | 257/94 |
| 6,448,102 B1 | 9/2002 | Kneissl et al. | |
| 6,495,862 B1* | 12/2002 | Okazaki et al. | 257/103 |
| 6,555,847 B2* | 4/2003 | Hata et al. | 257/103 |
| 6,562,648 B1 | 5/2003 | Wong | |
| 6,573,537 B1 | 6/2003 | Steigerwald | |
| 6,613,461 B1 | 9/2003 | Sugahara | |
| 6,689,491 B1* | 2/2004 | Nii et al. | 428/690 |
| 6,723,165 B2 | 4/2004 | Ogawa et al. | |
| 6,727,518 B2 | 4/2004 | Uemura | |
| 6,800,500 B2 | 10/2004 | Coman | |
| 6,967,117 B2* | 11/2005 | Horng et al. | 438/22 |
| 7,019,323 B2 | 3/2006 | Shakuda | |
| 7,439,160 B2 | 10/2008 | Le Vaillant et al. | |
| 2002/0134987 A1 | 9/2002 | Takaoka | |
| 2003/0047741 A1 | 3/2003 | Hata et al. | |
| 2003/0218179 A1* | 11/2003 | Koide et al. | 257/95 |
| 2004/0072383 A1* | 4/2004 | Nagahama et al. | 438/47 |
| 2004/0259281 A1* | 12/2004 | Horng et al. | 438/22 |
| 2005/0104081 A1 | 5/2005 | Kim | |
| 2005/0199885 A1 | 9/2005 | Hata et al. | |
| 2005/0242361 A1 | 11/2005 | Bessho et al. | |
| 2005/0277218 A1* | 12/2005 | Nakajo et al. | 438/46 |
| 2006/0006398 A1* | 1/2006 | Hata | 257/94 |
| 2006/0017060 A1 | 1/2006 | Chen | |
| 2006/0043387 A1* | 3/2006 | Hata | 257/79 |
| 2006/0043405 A1 | 3/2006 | Hata | |
| 2006/0046328 A1 | 3/2006 | Raffetto | |
| 2006/0145159 A1 | 7/2006 | Yokoyama | |
| 2006/0151801 A1 | 7/2006 | Doan | |
| 2006/0202227 A1* | 9/2006 | Kim et al. | 257/103 |
| 2006/0226434 A1* | 10/2006 | Hata | 257/94 |
| 2006/0231852 A1 | 10/2006 | Kususe | |
| 2007/0001186 A1* | 1/2007 | Murai et al. | 257/98 |
| 2007/0102692 A1* | 5/2007 | Asahara et al. | 257/13 |
| 2008/0230904 A1* | 9/2008 | Lee | 257/751 |

FOREIGN PATENT DOCUMENTS

| | | |
|---|---|---|
| CN | 1453885 | 11/2003 |
| CN | 1747185 | 3/2006 |
| JP | 9-8403 | 1/1997 |
| JP | 2000-252224 | 9/2000 |
| JP | 2003-347587 | 12/2003 |
| JP | 2004-72052 | 3/2004 |
| JP | 2004-266240 A | 9/2004 |
| JP | 2005-311034 | 11/2005 |
| JP | 2006-049871 | 2/2006 |
| JP | 2006-073619 | 3/2006 |
| JP | 2006-073822 | 3/2006 |
| JP | 2006-319311 | 11/2006 |

OTHER PUBLICATIONS

Sze. Semiconductor Devices. Physics and Technology. 2nd Edition, p. 18.*
U.S. Office Action dated Feb. 23, 2007, directed to related U.S. Appl. No. 11/178,201.
U.S. Office Action dated Apr. 18, 2007, directed to related U.S. Appl. No. 11/216,547.
U.S. Office Action dated Jul. 30, 2007, directed to related U.S. Appl. No. 11/219,139.
U.S. Office Action dated Jan. 23, 2008, directed to related U.S. Appl. No. 11/178,201.
U.S. Office Action mailed on Nov. 28, 2008, directed towards U.S. Appl. No. 11/928,693; 10 pages.
U.S. Office Action mailed on Dec. 10, 2008, directed towards U.S. Appl. No. 11/219,139; 10 pages.
Hata, T.,U.S. Office Action mailed on Jan. 20, 2010 directed towards related U.S. Appl. No. 11/928,693; 12 pages.
U.S. Office Action mailed Feb. 22, 2008, directed to related U.S. Appl. No. 11/219,139. 12 pages.
U.S. Office Action mailed Mar. 18, 2008, directed to related U.S. Appl. No. 11/403,511. (6 pages).
Chinese Office Action mailed on Feb. 13, 2009, directed towards counterpart foreign application No. 2007101496269; 8 pages.
Hata, U.S. Office Action mailed on Apr. 13, 2009, directed to related U.S. Appl. No. 11/403,511; 5 pages.
U.S. Office Action, mailed Jun. 11, 2008, directed to related U.S. Appl. No. 11/219,139. 13 pages.
Hata, U.S. Office Action mailed on Jul. 21, 2009, directed towards related U.S. Appl. No. 11/403,511; (3 pages).
Hata, U.S. Office Action mailed Jun. 10, 2009, directed towards related U.S. Appl. No. 11/928,693; (12 pages).
Wolf, Stanley et al. ( 2000). *Silicon Processing for the VLSI Era*. Lattice Press, Second Ed. vol. 1, pp. 666-667, 678, 681.
U.S. Office Action mailed on Sep. 28, 2009, directed towards related U.S. Appl. No. 11/928,693; 3 pages.
U.S. Office Action mailed on Sep. 25, 2008, directed towards U.S. Appl. No. 11/403,511; 5 pages.
Hata, U.S. Office Action mailed Jul. 8, 2010, directed to related U.S. Appl. No. 11/928,693; 12 pages.

* cited by examiner

NITRIDE SEMICONDUCTOR LIGHT-EMITTING ELEMENT AND METHOD OF MANUFACTURING THE SAME

This nonprovisional application is based on Japanese Patent Applications Nos. 2006-244195 and 2007-145584 filed with the Japan Patent Office on Sep. 8, 2006 and May 31, 2007, respectively, the entire contents of which are hereby incorporated by reference.

BACKGROUND OF THE INVENTION

1. Field of the Invention

The present invention relates to a nitride semiconductor light-emitting element and a method of manufacturing the same, and particularly relates to a nitride semiconductor light-emitting element and a method of manufacturing the same, which can improve manufacturing yield and reliability.

2. Description of the Background Art

A nitride semiconductor, which is represented by a composition formula $In_aGa_bAl_cN$ (where a+b+c=1, $0 \le a<1$, $0<b \le 1$, $0 \le c<1$), for example, has a large energy band gap and high thermal stability. As to the nitride semiconductor, a band gap width can even be controlled by adjustment of the composition thereof. Accordingly, the nitride semiconductor is expected to serve as a material applicable to a nitride semiconductor light-emitting element such as a light-emitting diode or a laser diode, as well as various semiconductor devices, a typical example of which is a high-temperature device.

As to a light-emitting diode utilizing a nitride semiconductor, in particular, one having a luminous intensity as high as a few candelas in a wavelength range from blue light to green light has already been developed and implemented. Furthermore, implementation of a laser diode utilizing a nitride semiconductor is becoming a focus of research and development, as a light source of a pickup for a high-capacity optical disk medium.

For example, Patent Document 1 (Japanese Patent Laying-Open No. 09-008403) discloses an example of a conventional nitride semiconductor light-emitting element having an upper and lower electrode structure. As shown in a schematic cross-sectional view in FIG. 21, the conventional nitride semiconductor light-emitting element is configured such that a first ohmic electrode layer 102 and a second ohmic electrode layer 101 are formed on a conductive substrate 100 made of a p-type GaAs and having a positive electrode layer 107 formed thereat, that a nitride semiconductor layer stacked structure 108 in which a p-type nitride semiconductor layer 103, a light-emitting layer 104, and an n-type nitride semiconductor layer 105 are stacked in this order is formed on second ohmic electrode layer 101, and that a negative electrode layer 106 is formed on n-type nitride semiconductor layer 105.

The conventional nitride semiconductor light-emitting element is formed by joining, through thermocompression bonding, first ohmic electrode layer 102 formed on conductive substrate 100 and second ohmic electrode layer 101 formed on nitride semiconductor layer stacked structure 108 stacked on a sapphire substrate (not shown), and subsequently removing the sapphire substrate.

SUMMARY OF THE INVENTION

However, when an entire surface of conductive substrate 100 having a large area is joined through thermocompression bonding to an entire surface of nitride semiconductor layer stacked structure 108, with first ohmic electrode layer 102 and second ohmic electrode layer 101 interposed therebetween, uniform heating and pressure bonding of these entire surfaces are difficult. Accordingly, there is exhibited poor adhesion between conductive substrate 100 and nitride semiconductor layer stacked structure 108, and hence there arises a problem of peeling of these entire surfaces.

Furthermore, there is also exhibited poor adhesion between conductive substrate 100 and first ohmic electrode layer 102, and hence there arises a problem of peeling of all or a part of conductive substrate 100 from first ohmic electrode layer 102.

If conductive substrate 100 is entirely peeled off from first ohmic electrode layer 102, the sapphire substrate cannot be removed, resulting in a problem of not being able to fabricate a nitride semiconductor light-emitting element.

If conductive substrate 100 is partially peeled off from first ohmic electrode layer 102, current injected into the nitride semiconductor light-emitting element fails to flow successfully between nitride semiconductor layer stacked structure 108 and conductive substrate 100, causing increase in operating voltage. Accordingly, there arises a problem of deterioration in reliability of the nitride semiconductor light-emitting element.

Furthermore, if conductive substrate 100 is partially peeled off from first ohmic electrode layer 102, there arises a problem of peeling of conductive substrate 100 from first ohmic electrode layer 102 when a wafer is diced into respective nitride semiconductor light-emitting elements, which problem contributes to decrease in manufacturing yield.

Furthermore, if conductive substrate 100 is partially peeled off from first ohmic electrode layer 102, a solvent, a resist, or an etching liquid penetrates in between conductive substrate 100 and first ohmic electrode layer 102 during a manufacturing process. If the nitride semiconductor light-emitting element is applied to a lamp, resin, moisture, or the like intrudes therein through the peeled portion to cause further peeling, which may break first ohmic electrode layer 102 or second ohmic electrode layer 101. This causes a problem of deterioration in reliability of the nitride semiconductor light-emitting element.

Furthermore, if there is exhibited poor adhesion between conductive substrate 100 and first ohmic electrode layer 102 when an Au wire is bonded to negative electrode layer 106, for example, peeling occurs between conductive substrate 100 and first ohmic electrode layer 102, resulting in a problem of increase in operating voltage.

Accordingly, an object of the present invention is to provide a nitride semiconductor light-emitting element and a method of manufacturing the same, which can improve manufacturing yield and reliability.

According to a first aspect of the present invention, it is possible to provide a nitride semiconductor light-emitting element including: a transparent conductor; a first conductivity-type nitride semiconductor layer; a light-emitting layer; and a second conductivity-type nitride semiconductor layer, the first conductivity-type nitride semiconductor layer, the light-emitting layer, and the second conductivity-type nitride semiconductor layer being successively stacked on the transparent conductor.

Here, in the first aspect of the present invention, the transparent conductor preferably contains indium tin oxide (composite oxide of indium and tin, which is hereinafter also referred to as "ITO"), zinc oxide, tin oxide, cadmium oxide, cadmium indium oxide (composite oxide of cadmium and indium), cadmium tin oxide (composite oxide of cadmium and tin), zinc tin oxide (composite oxide of zinc and tin), indium zinc oxide (composite oxide of indium and zinc), magnesium indium oxide (composite oxide of magnesium and indium), calcium gallium oxide (composite oxide of calcium and gallium), titanium nitride, zirconium nitride, haffiium nitride, or lanthanum boride.

According to a second aspect of the present invention, it is possible to provide a nitride semiconductor light-emitting element including: a first transparent conductor, a metal layer; a second transparent conductor; a first conductivity-type nitride semiconductor layer; a light-emitting layer; and a second conductivity-type nitride semiconductor layer, the metal layer, the second transparent conductor, the first conductivity-type nitride semiconductor layer, the light-emitting layer, and the second conductivity-type nitride semiconductor layer being successively stacked on the first transparent conductor.

Here, in the second aspect of the present invention, a surface of the second conductivity-type nitride semiconductor layer preferably has irregularities.

Further in the second aspect of the present invention, a thickness of the second transparent conductor is preferably smaller than a thickness of the first transparent conductor. In the present invention, the "thickness" of course refers to a thickness in a growth direction of the nitride semiconductor layer.

Further in the second aspect of the present invention, at least one of the first transparent conductor and the second transparent conductor preferably contains indium tin oxide, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride.

Further in the second aspect of the present invention, a surface of the second transparent conductor on the metal layer-side preferably has irregularities.

Further in the second aspect of the present invention, a surface of the second transparent conductor on the metal layer-side preferably has a dimple. In the present invention, the "dimple" refers to a recess having a curved surface.

Further in the second aspect of the present invention, the metal layer preferably includes at least one selected from the group consisting of a metal adhesive layer, a metal barrier layer, and a metal reflective layer. In the present invention, the "metal adhesive layer" refers to a layer having a function of being able to further suppress peeling of layers from each other located with the metal adhesive layer interposed therebetween, when compared with the case where no metal adhesive layer is formed. In the present invention, the "metal barrier layer" refers to a layer having a function of being able to further suppress migration of atoms between layers located with the metal barrier layer interposed therebetween, when compared with the case where no metal barrier layer is formed. In the present invention, the "metal reflective layer" refers to a layer having a function of reflecting at least a part of light from the light-emitting layer.

Further in the second aspect of the present invention, the metal adhesive layer preferably contains chromium or a chromium alloy (an alloy of chromium and at least one type of metal other than chromium).

Further in the second aspect of the present invention, the metal barrier layer preferably contains nickel, titanium, a nickel-titanium alloy, or platinum.

Further in the second aspect of the present invention, the metal reflective layer preferably contains at least one selected from the group consisting of silver, platinum, aluminum, rhodium, a silver-neodymium alloy (an alloy of silver and neodymium), a silver-neodymium-copper alloy (an alloy of silver, neodymium, and copper), a silver-palladium alloy (an alloy of silver and palladium), a silver-palladium-copper alloy (an alloy of silver, palladium, and copper), a silver-bismuth alloy (an alloy of silver and bismuth), and a silver-neodymium-gold alloy (an alloy of silver, neodymium, and gold).

Further in the second aspect of the present invention, a surface of the nitride semiconductor light-emitting element on the first transparent conductor-side can be made to serve as a mounting surface.

Further in the first and second aspects of the present invention, the first conductivity-type nitride semiconductor layer may contain at least magnesium, and the second conductivity-type nitride semiconductor layer may contain at least silicon.

Further in the first aspect of the present invention, the first conductivity-type nitride semiconductor layer, the light-emitting layer, and the second conductivity-type nitride semiconductor layer are preferably located on the transparent conductor inside a region surrounded by an exposed surface obtained by exposing a part of a surface of the transparent conductor.

Further in the first aspect of the present invention, a part of a surface of the transparent conductor is exposed so as to surround the periphery of the first conductivity-type nitride semiconductor layer, the light-emitting layer, and the second conductivity-type nitride semiconductor layer.

Further in the second aspect of the present invention, the first conductivity-type nitride semiconductor layer, the light-emitting layer, and the second conductivity-type nitride semiconductor layer are preferably located on the second transparent conductor inside a region surrounded by an exposed surface obtained by exposing a part of a surface of the second transparent conductor.

Further in the second aspect of the present invention, a part of a surface of the transparent conductor is exposed so as to surround the periphery of the first conductivity-type nitride semiconductor layer, the light-emitting layer, and the second conductivity-type nitride semiconductor layer.

According to a third aspect of the present invention, it is possible to provide a method of manufacturing the above-described nitride semiconductor light-emitting element, including the steps of: stacking the second conductivity-type nitride semiconductor layer, the light-emitting layer, and the first conductivity-type nitride semiconductor layer containing magnesium on a substrate in this order; forming the transparent conductor on the first conductivity-type nitride semiconductor layer; and heating the transparent conductor to a temperature of not less than 500° C. for not less than 10 minutes.

Here, in the third aspect of the present invention, the transparent conductor preferably contains indium tin oxide, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride.

Further in the third aspect of the present invention, the step of exposing a part of a surface of the transparent conductor by removing the second conductivity-type nitride semiconductor layer, the light-emitting layer, and the first conductivity-type nitride semiconductor layer is preferably included.

According to a fourth aspect of the present invention, it is possible to provide a method of manufacturing the above-described nitride semiconductor light-emitting element, including the steps of stacking the second conductivity-type nitride semiconductor layer, the light-emitting layer, and the first conductivity-type nitride semiconductor layer containing magnesium on a substrate in this order; forming the second transparent conductor on the first conductivity-type nitride semiconductor layer; heating the second transparent conductor to a temperature of not less than 500° C. for not less than 10 minutes; forming the metal layer after the heating, and forming the first transparent conductor.

According to a fifth aspect of the present invention, it is possible to provide a method of manufacturing the above-described nitride semiconductor light-emitting element, including the steps of: stacking the second conductivity-type nitride semiconductor layer, the light-emitting layer, and the first conductivity-type nitride semiconductor layer containing magnesium on a substrate in this order; forming the second transparent conductor on the first conductivity-type nitride semiconductor layer; heating the second transparent conductor to a temperature of not less than 500° C. for not less than 10 minutes; forming the irregularities at the surface of the second transparent conductor after the heating; forming the metal layer; and forming the first transparent conductor.

Further in the fourth and fifth aspects of the present invention, at least one of the first transparent conductor and the second transparent conductor preferably contains indium tin oxide, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride.

Further in the fourth and fifth aspects of the present invention, the step of exposing a part of a surface of the second transparent conductor by removing the second conductivity-type nitride semiconductor layer, the light-emitting layer, and the first conductivity-type nitride semiconductor layer is preferably included.

Further in the third, fourth, and fifth aspects of the present invention, the substrate preferably contains at least one selected from the group consisting of sapphire, gallium arsenide, gallium phosphide, silicon, and germanium.

Further in the third, fourth, and fifth aspects of the present invention, the step of removing the substrate may be included.

In the present invention, as to the nitride semiconductor layer that forms each of the first conductivity-type nitride semiconductor layer, the light-emitting layer, and the second conductivity-type nitride semiconductor layer, it is possible to use, for example, a layer made of a nitride semiconductor crystal represented by a composition formula $Al_xGa_yIn_zN$ (note that $0 \leq x \leq 1$, $0 \leq y \leq 1$, $0 \leq z \leq 1$, $x+y+z \neq 0$). Note that in the above-described composition formula, x represents a composition ratio of aluminum (Al), y represents a composition ratio of gallium (Ga), and z represents a composition ratio of indium (In).

According to the present invention, it is possible to provide a nitride semiconductor light-emitting element and a method of manufacturing the same, which can improve manufacturing yield and reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
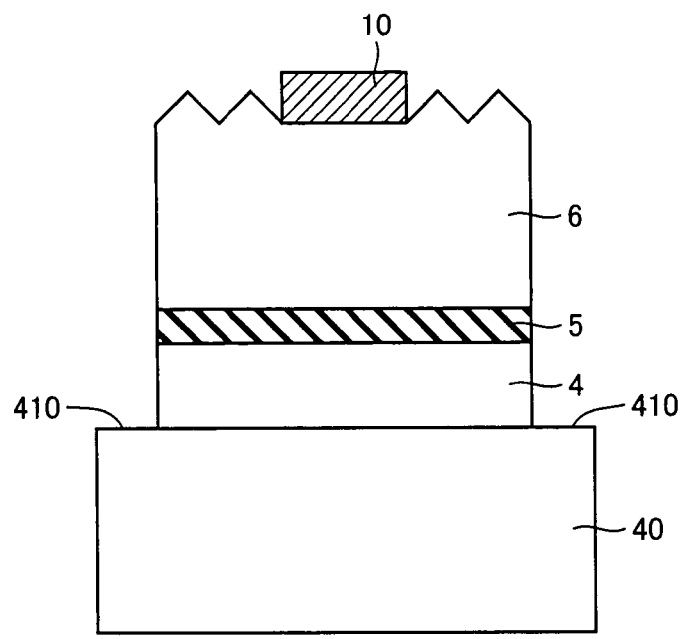
FIG. 1 is a schematic cross-sectional view of a preferable example of a nitride semiconductor light-emitting element according to the present invention.

Embodiments of the present invention will hereinafter be described. In the drawings in the present invention, the same reference characters represent the same or corresponding portions.

First Embodiment

FIG. 1 is a schematic cross-sectional view of a preferable example of a nitride semiconductor light-emitting element according to the present invention. The nitride semiconductor light-emitting element is configured such that a magnesium (Mg)-doped p-type nitride semiconductor layer 4, a light-emitting layer 5 having a Multiple Quantum Well (MQW) structure made of a nitride semiconductor, a silicon (Si)-doped n-type nitride semiconductor layer 6, and an n-side bonding pad electrode 10 made of a stacked body of a Ti layer and an Au layer, are stacked in this order on a transparent conductor 40 made of ITO. Here, n-type nitride semiconductor layer 6 has a surface having irregularities formed thereat. Furthermore, the nitride semiconductor light-emitting element has an exposed surface 410 where an outer peripheral portion of a surface of transparent conductor 40 on the nitride semiconductor layer (here, p-type nitride semiconductor layer 4, light-emitting layer 5, and n-type nitride semiconductor layer 6)-side is exposed. Accordingly, p-type nitride semiconductor layer 4, light-emitting layer 5, and n-type nitride semiconductor layer 6 are located on the surface of transparent conductor 40 inside a region surrounded by exposed surface 410.

A preferable example of a method of manufacturing the nitride semiconductor light-emitting element shown in FIG. 1 will hereinafter be descried. Initially, as shown in a schematic cross-sectional view in FIG. 2, a buffer layer 2 made of GaN, an undoped nitride semiconductor layer 3, n-type nitride semiconductor layer 6, light-emitting layer 5, and p-type nitride semiconductor layer 4 are grown in this order on a sapphire substrate 1 by, for example, a Metal Organic Chemical Vapor Deposition (MOCVD) method. Here, buffer layer 2 may have a thickness of, for example, 20 nm, and undoped nitride semiconductor layer 3 may have a thickness of, for example, 1 µm. Furthermore, n-type nitride semiconductor layer 6 has a thickness of, for example, 4 µm, light-emitting layer 5 may have a thickness of, for example, 50 µm, and p-type nitride semiconductor layer 4 may have a thickness of, for example, 150 µm. Note that undoped nitride semiconductor layer 3 may not be grown.

Figure 3:
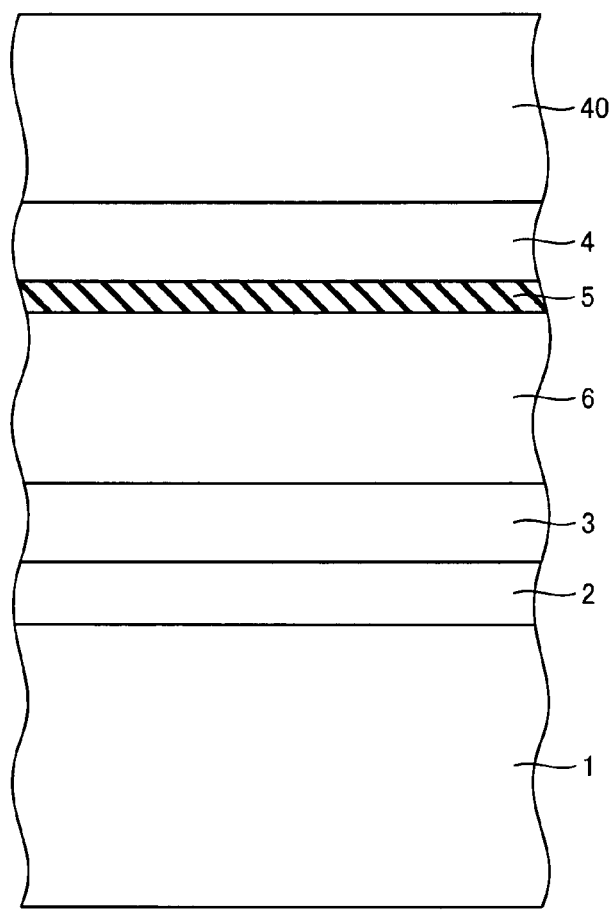

Next, as shown in a schematic cross-sectional view in FIG. 3, transparent conductor 40 made of ITO having a thickness of 50 µm, for example, is formed on p-type nitride semiconductor layer 4 by, for example, an evaporation method. Successively, the wafer obtained after formation of transparent conductor 40 is heated. Here, transparent conductor 40 is preferably heated to a temperature of not less than 500° C. and not more than 800° C., and more preferably a temperature of not less than 500° C. and not more than 650° C., in order to improve transmittance and reduce resistivity for serving as a transparent conductor. Furthermore, from a viewpoint of allowing the transparent conductor to further exhibit its function, transparent conductor 40 is preferably heated to the above-described temperature (preferably not less than 500° C. and not more than 800° C., more preferably not less than 500° C. and not more than 650° C.), for not less than 10 minutes and not more than 60 minutes, and more preferably for not less than 10 minutes and not more than 30 minutes.

Figure 4:
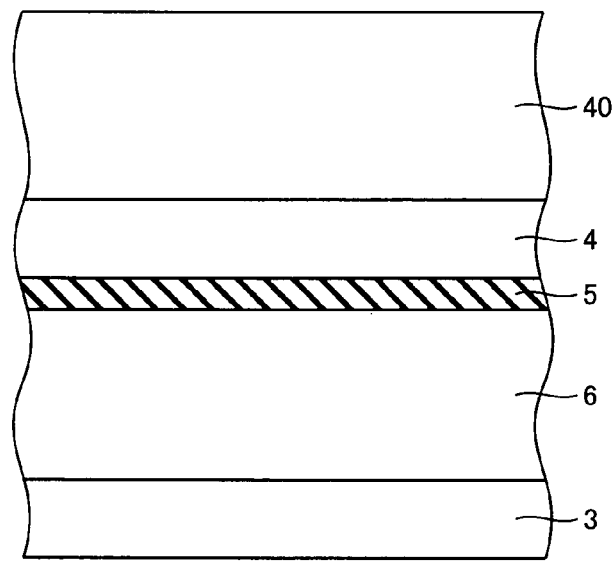

YAG-THG laser light (wavelength of 355 µm) is subsequently applied from the rear surface-side of sapphire substrate 1, the rear surface being mirror-polished, so that sapphire substrate 1, buffer layer 2, and a part of undoped nitride semiconductor layer 3 are thermally decomposed to remove sapphire substrate 1 and buffer layer 2 as shown in a schematic cross-sectional view in FIG. 4.

Figure 5:
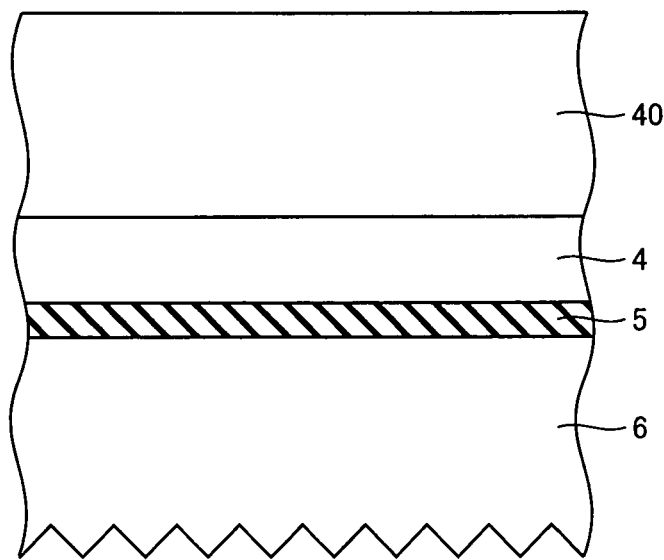

Undoped nitride semiconductor layer 3 is then ground to expose a surface of n-type nitride semiconductor layer 6. As shown in a schematic cross-sectional view in FIG. 5, irregularities are formed at the surface of n-type nitride semiconductor layer 6 by Reactive Ion Etching (RIE) or the like.

Figure 6:
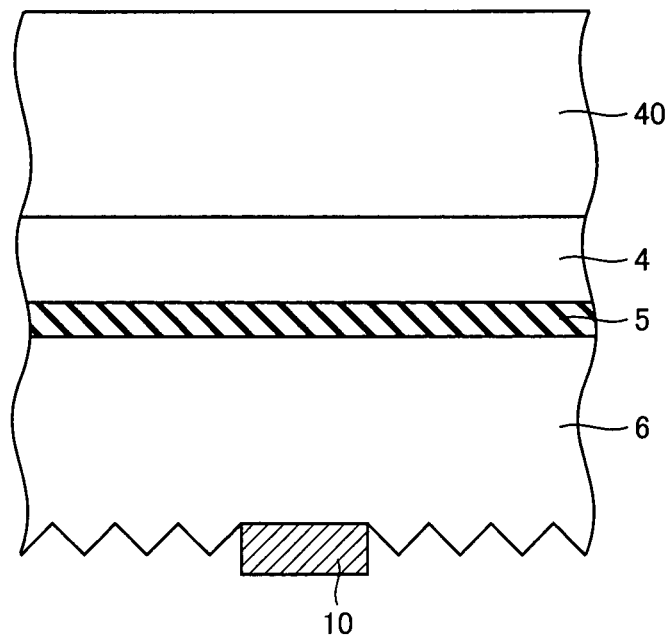

Next, as shown in a schematic cross-sectional view in FIG. 6, an n-side bonding pad electrode 10 is formed at a part of the surface of n-type nitride semiconductor layer 6 by stacking a Ti layer and an Au layer suitable for serving as a bonding pad, in this order on the surface of n-type nitride semiconductor layer 6 by, for example, an evaporation method or the like. An Au wire (not shown) is then ball-bonded onto n-side bonding pad electrode 10.

Figure 7:
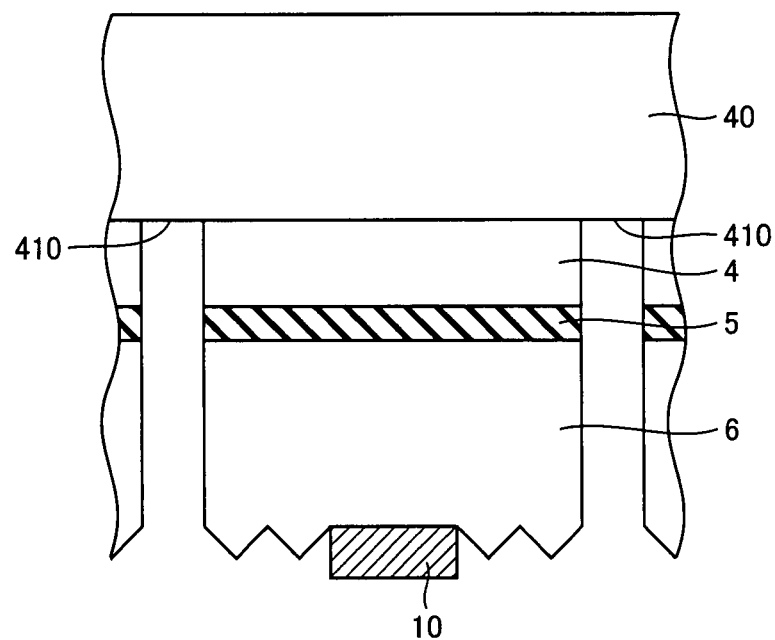

Successively, as shown in a schematic cross-sectional view in FIG. 7, a part of each of p-type nitride semiconductor layer 4, light-emitting layer 5, and n-type nitride semiconductor layer 6 is etched by RIE or the like to expose a part of the surface of transparent conductor 40. Accordingly, exposed surface 410 is formed.

The etched wafer as described above is divided into a plurality of chips, so that there is obtained a nitride semiconductor light-emitting element according to the present invention as shown in FIG. 1. The nitride semiconductor light-emitting element obtained as such is packaged such that a surface thereof on the transparent conductor 40-side serves as a mounting surface to be mounted on a mounting member.

As described above, in the present embodiment, transparent conductor 40 made of ITO performs both of a function of a supporting substrate for removing the sapphire substrate, and a function of a conductive substrate for forming an upper and lower electrode structure. Accordingly, in the present embodiment, junction by thermocompression bonding is not required for forming the upper and lower electrode structure, and it is possible to significantly reduce conventional peeling, warpage of the substrate caused by thermocompression bonding, and others, so that manufacturing yield and reliability of the nitride semiconductor light-emitting element can be improved. Furthermore, in the present embodiment, it is also possible to effectively prevent increase in operating voltage of the nitride semiconductor light-emitting element, which increase is attributable to peeling.

Furthermore, in the present embodiment, formation of exposed surface 410 makes it possible to easily divide the etched wafer when the wafer is divided into a plurality of chips.

Furthermore, in the present embodiment, there is no need to divide a pn junction when the wafer is divided into chips, so that a short circuit is less likely to occur.

Furthermore, in the present embodiment, chipping, cracking, and peeling of the nitride semiconductor layer (p-type nitride semiconductor layer 4, light-emitting layer 5, and n-type nitride semiconductor layer 6) on transparent conductor 40 are also reduced, so that reliability of the nitride semiconductor light-emitting element is improved, and illumination failure of the nitride semiconductor light-emitting element can be reduced.

In the present embodiment, transparent conductor 40 is preferably formed to have a thickness of not less than 40 µm and not more than 400 µm, and more preferably a thickness of not less than 50 µm and not more than 120 µm. If transparent conductor 40 is formed to have a thickness of not less than 40 µm and not more than 400 µm, and particularly a thickness of not less than 50 µm and not more than 120 µm, transparent conductor 40 tends to more efficiently perform both of the function of the supporting substrate for removing the sapphire substrate, and the function of the conductive substrate for forming the upper and lower electrode structure.

Second Embodiment

Figure 8:
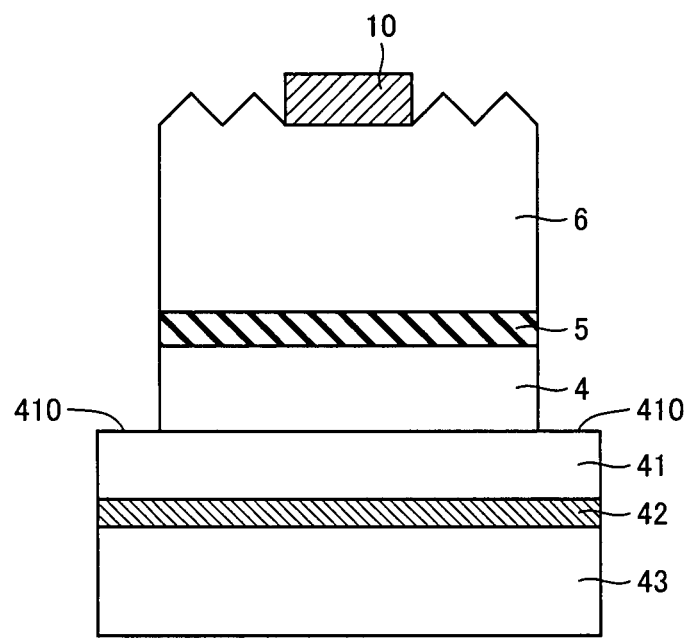
FIG. 8 is a schematic cross-sectional view of another preferable example of the nitride semiconductor light-emitting element according to the present invention.

FIG. 8 is a schematic cross-sectional view of another preferable example of the nitride semiconductor light-emitting element according to the present invention. The nitride semiconductor light-emitting element is configured such that a metal layer 42, a second transparent conductor 41, Mg-doped p-type nitride semiconductor layer 4, light-emitting layer 5 having an MQW structure made of a nitride semiconductor, Si-doped n-type nitride semiconductor layer 6, and n-side bonding pad electrode 10 made of a stacked body of a Ti layer and an Au layer, are stacked in this order on a first transparent conductor 43 made of ITO. N-type nitride semiconductor layer 6 has a surface having irregularities formed thereat. Furthermore, the nitride semiconductor light-emitting element has exposed surface 410 where an outer peripheral portion of a surface of second transparent conductor 41 on the nitride semiconductor layer (here, p-type nitride semiconductor layer 4, light-emitting layer 5, and n-type nitride semiconductor layer 6)-side is exposed. Accordingly, p-type nitride semiconductor layer 4, light-emitting layer 5, and n-type nitride semiconductor layer 6 are located on the surface of second transparent conductor 41 inside a region surrounded by exposed surface 410.

Figure 2:
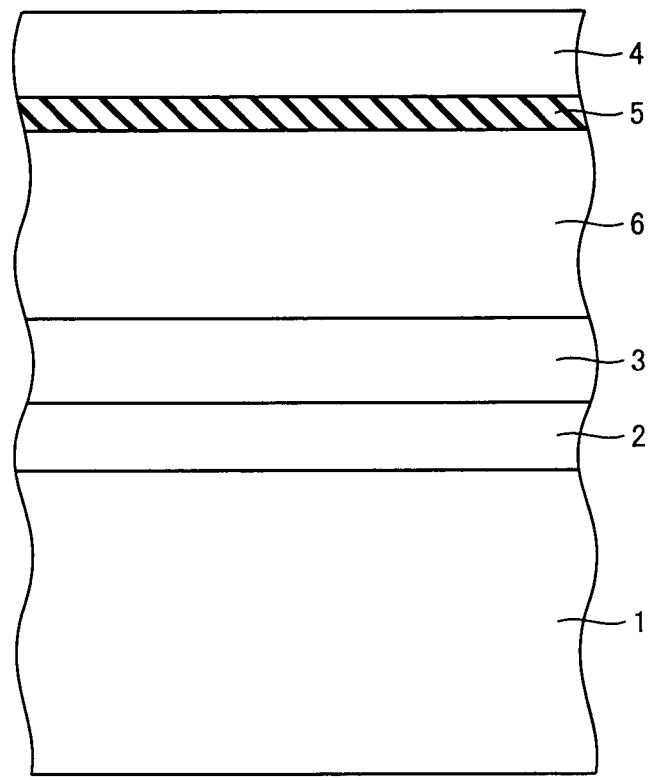
FIGS. 2-7 are schematic cross-sectional views each showing a part of a manufacturing process in a method of manufacturing the nitride semiconductor light-emitting element according to the present invention shown in FIG. 1.

A preferable example of a method of manufacturing the nitride semiconductor light-emitting element shown in FIG. 8 will hereinafter be descried. Initially, as shown in FIG. 2, buffer layer 2 made of GaN, undoped nitride semiconductor layer 3, n-type nitride semiconductor layer 6, light-emitting layer 5, and p-type nitride semiconductor layer 4 are grown in this order on sapphire substrate 1 by, for example, an MOCVD method. This procedure thus far is similar to that of the first embodiment.

Figure 9:
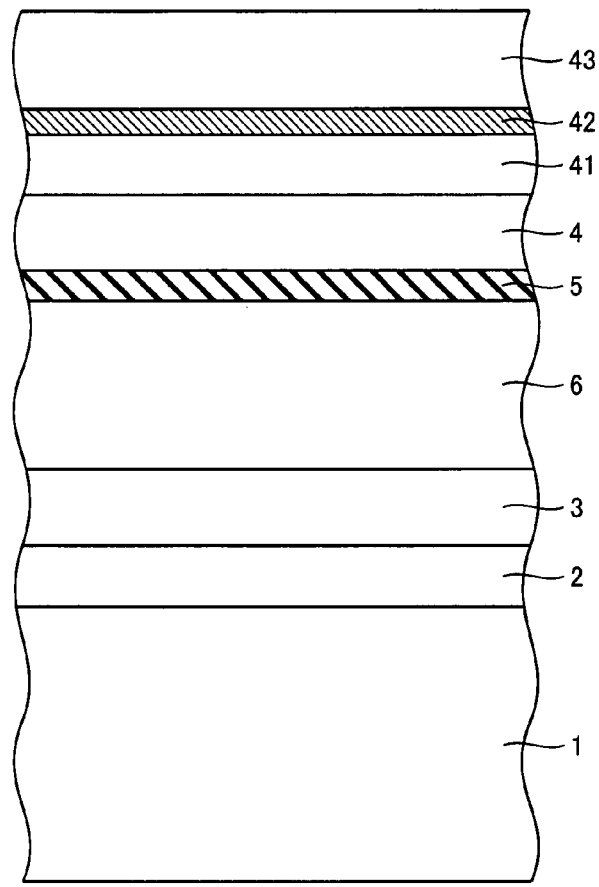
FIGS. 9-13 are schematic cross-sectional views each showing a part of a manufacturing process in a method of manufacturing the nitride semiconductor light-emitting element according to the present invention shown in FIG. 8.

Next, as shown in a schematic cross-sectional view in FIG. 9, second transparent conductor 41 made of ITO having a thickness of 40 μm, for example, metal layer 42 made of a silver-neodymium alloy (Ag—Nd) film, and first transparent conductor 43 made of ITO having a thickness of 50 μm, for example, are stacked in this order on p-type nitride semiconductor layer 4 by, for example, an evaporation method or the like.

Here, second transparent conductor 41 is preferably heated to a temperature of not less than 500° C. and not more than 800° C., and more preferably a temperature of not less than 500° C. and not more than 650° C., in order to improve transmittance and reduce resistivity for serving as a transparent conductor. Furthermore, from a viewpoint of allowing the transparent conductor to further exhibit its function, second transparent conductor 41 is preferably heated to the above-described temperature (preferably not less than 500° C. and not more than 800° C., more preferably not less than 500° C. and not more than 650° C.), for not less than 10 minutes and not more than 60 minutes, and more preferably for not less than 10 minutes and not more than 30 minutes.

Figure 10:
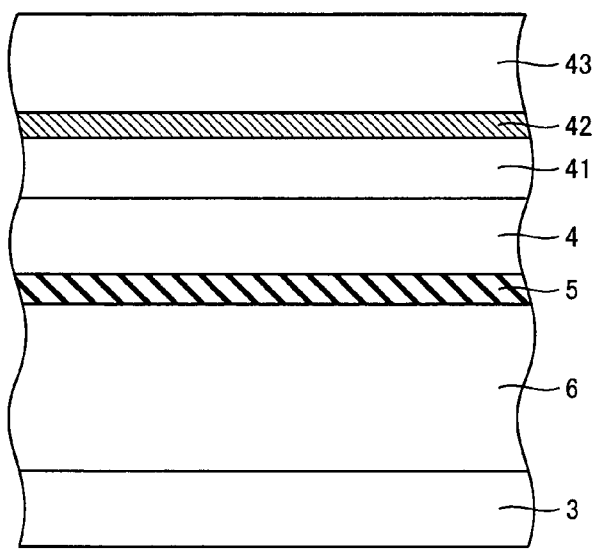

YAG-THG laser light (wavelength of 355 nm) is subsequently applied from the rear surface-side of sapphire substrate 1, the rear surface being mirror-polished, so that sapphire substrate 1, buffer layer 2, and a part of undoped nitride semiconductor layer 3 are thermally decomposed to remove sapphire substrate 1 and buffer layer 2 as shown in a schematic cross-sectional view in FIG. 10.

Figure 11:
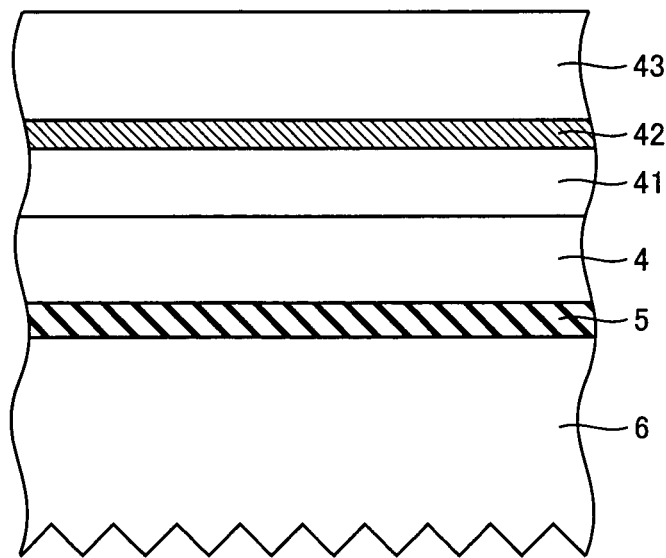

Undoped nitride semiconductor layer 3 is then ground to expose the surface of n-type nitride semiconductor layer 6. As shown in a schematic cross-sectional view in FIG. 11, irregularities are formed at the surface of n-type nitride semiconductor layer 6 by RIE or the like.

Figure 12:
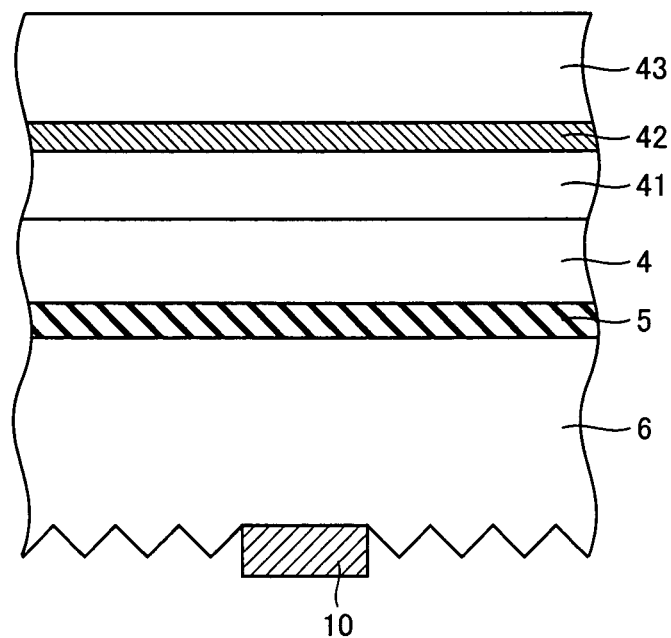

Next, as shown in a schematic cross-sectional view in FIG. 12, n-side bonding pad electrode 10 is formed at a part of the surface of n-type nitride semiconductor layer 6 by stacking a Ti layer and an Au layer suitable for serving as a bonding pad, in this order on the surface of n-type nitride semiconductor layer 6 by, for example, an evaporation method or the like. An Au wire (not shown) is then ball-bonded onto n-side bonding pad electrode 10.

Figure 13:
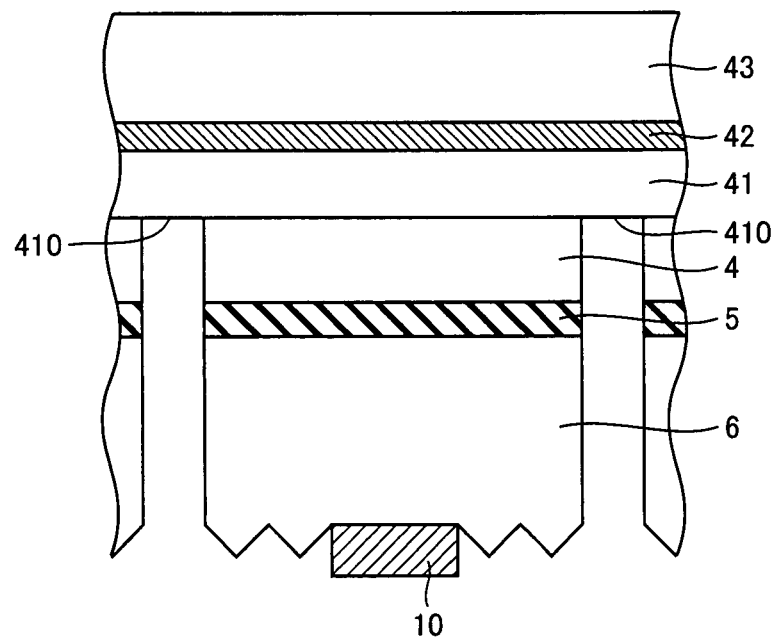

Successively, as shown in a schematic cross-sectional view in FIG. 13, a part of each of p-type nitride semiconductor layer 4, light-emitting layer 5, and n-type nitride semiconductor layer 6 is etched by RIE or the like to expose a part of the surface of second transparent conductor 41. Accordingly, exposed surface 410 is formed.

The etched wafer as described above is divided into a plurality of chips, so that there is obtained a nitride semiconductor light-emitting element according to the present invention as shown in FIG. 8. The nitride semiconductor light-emitting element obtained as such is packaged such that a surface thereof on the first transparent conductor 43-side serves as a mounting surface to be mounted on a mounting member.

As described above, in the present embodiment, the stacked body of first transparent conductor 43 made of ITO, metal layer 42 made of an Ag—Nd film, and second transparent conductor 41 made of ITO performs both of a function of a supporting substrate for removing the sapphire substrate, and a function of a conductive substrate for forming an upper and lower electrode structure. Accordingly, in the present embodiment as well, junction by thermocompression bonding is not required for forming the upper and lower electrode structure, and it is possible to significantly reduce conventional peeling, warpage of the substrate caused by thermocompression bonding, and others, so that manufacturing yield and reliability of the nitride semiconductor light-emitting element can be improved. Furthermore, in the present embodiment as well, it is also possible to effectively prevent increase in operating voltage of the nitride semiconductor light-emitting element, which increase is attributable to peeling.

Furthermore, in the nitride semiconductor light-emitting element according to the present embodiment, the metal layer between the first transparent conductor and the second transparent conductor has a function of a metal reflective layer that reflects at least a part of light emitted from the light-emitting layer, so that more light can be extracted than in the nitride semiconductor light-emitting element in the first embodiment. Accordingly, the nitride semiconductor light-emitting element according to the present embodiment is superior in external extraction efficiency of light, and hence can serve as a nitride semiconductor light-emitting element having favorable reliability.

Furthermore, in the nitride semiconductor light-emitting element according to the present embodiment, formation of exposed surface 410 makes it possible to easily divide the etched wafer when the wafer is divided into a plurality of chips.

Furthermore, in the nitride semiconductor light-emitting element according to the present embodiment, there is no need to divide a pn junction when the wafer is divided into chips, so that a short circuit is less likely to occur.

Furthermore, in the nitride semiconductor light-emitting element according to the present embodiment, chipping, cracking, and peeling of the nitride semiconductor layer (p-type nitride semiconductor layer 4, light-emitting layer 5, and n-type nitride semiconductor layer 6) on second transparent conductor 41 are also reduced, so that reliability of the nitride semiconductor light-emitting element is improved, and illumination failure of the nitride semiconductor light-emitting element can be reduced.

Furthermore, in the nitride semiconductor light-emitting element according to the present embodiment, two transparent conductors, namely, first transparent conductor 43 and second transparent conductor 41 are used as transparent conductors, so that it is possible to form a transparent conductor having a large film thickness.

In the present embodiment, the stacked body of first transparent conductor 43, metal layer 42, and second transparent conductor 41 is preferably formed to have a total thickness of not less than 40 μm and not more than 400 μm, and more preferably a total thickness of not less than 50 μm and not more than 120 μm. If the stacked body is formed to have a total thickness of not less than 40 μm and not more than 400 μm, and particularly a thickness of not less than 50 μm and not more than 120 μm, the stacked body tends to more efficiently perform both of the function of the supporting substrate for removing the sapphire substrate, and the function of the conductive substrate for forming the upper and lower electrode structure.

Furthermore, second transparent conductor 41 is preferably formed to have a thickness smaller than that of first transparent conductor 43. If second transparent conductor 41 is formed to have a thickness smaller than that of first transparent conductor 43, extraction efficiency of light emitted from light-emitting layer 42 tends to improve.

Third Embodiment

Figure 14:
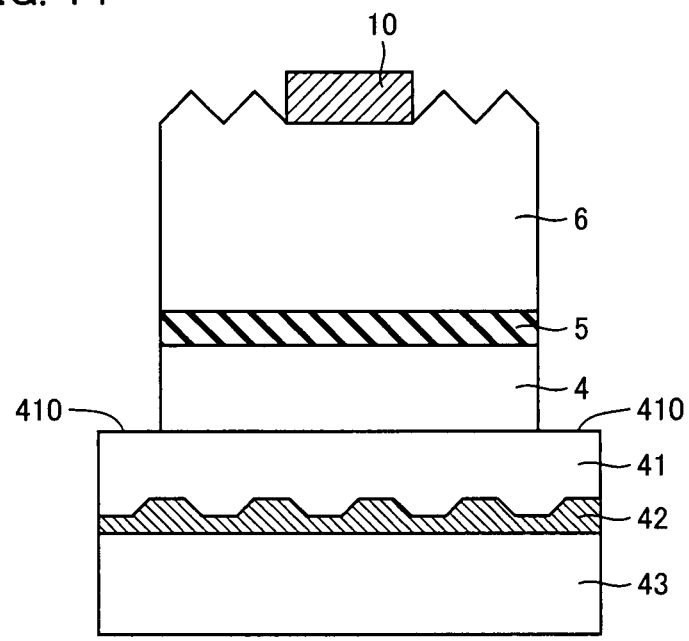
FIG. 14 is a schematic cross-sectional view of still another example of the nitride semiconductor light-emitting element according to the present invention.

FIG. 14 is a schematic cross-sectional view of still another preferable example of the nitride semiconductor light-emitting element according to the present invention. The nitride semiconductor light-emitting element is configured such that metal layer 42, second transparent conductor 41, Mg-doped p-type nitride semiconductor layer 4, light-emitting layer 5 having an MQW structure made of a nitride semiconductor, Si-doped n-type nitride semiconductor layer 6, and n-side bonding pad electrode 10 made of a stacked body of a Ti layer and an Au layer, are stacked in this order on first transparent conductor 43 made of ITO. Furthermore, irregularities are formed at the surface of n-type nitride semiconductor layer 6, and at a surface of second transparent conductor 41 on the metal layer 42-side. Furthermore, the nitride semiconductor light-emitting element has exposed surface 410 where an outer peripheral portion of the surface of second transparent conductor 41 on the nitride semiconductor layer (here, p-type nitride semiconductor layer 4, light-emitting layer 5, and n-type nitride semiconductor layer 6)-side is exposed. Accordingly, p-type nitride semiconductor layer 4, light-emitting layer 5, and n-type nitride semiconductor layer 6 are located on the surface of second transparent conductor 41 inside a region surrounded by exposed surface 410.

A preferable example of a method of manufacturing the nitride semiconductor light-emitting element shown in FIG. 14 will hereinafter be descried. Initially, as shown in FIG. 2, buffer layer 2 made of GaN, undoped nitride semiconductor layer 3, n-type nitride semiconductor layer 6, light-emitting layer 5, and p-type nitride semiconductor layer 4 are grown in this order on sapphire substrate 1 by, for example, an MOCVD method. This procedure thus far is similar to that of the first and second embodiments.

Figure 15:
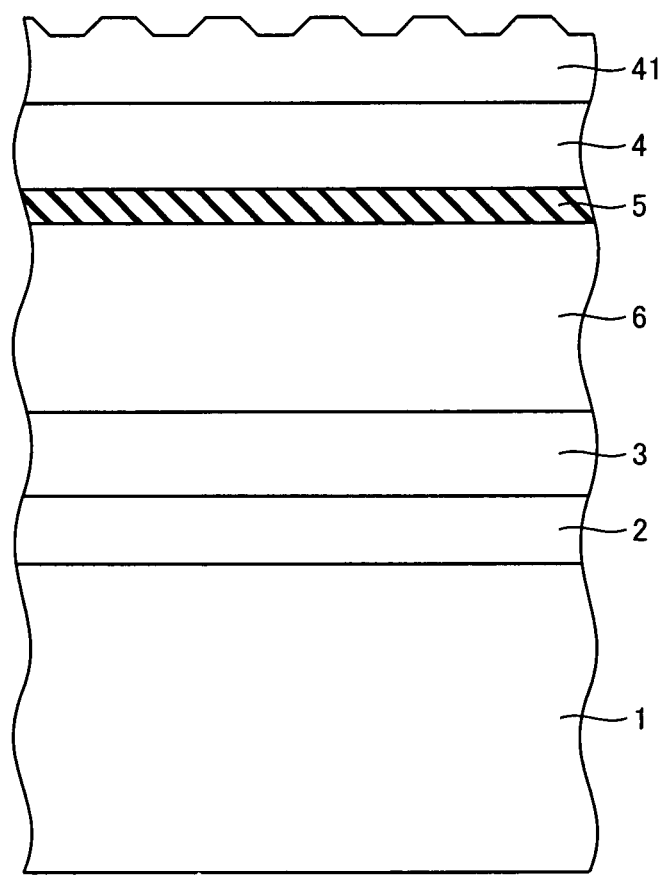
FIGS. 15-20 are schematic cross-sectional views each showing a part of a manufacturing process in a method of manufacturing the nitride semiconductor light-emitting element according to the present invention shown in FIG. 14.

Next, as shown in a schematic cross-sectional view in FIG. 15, second transparent conductor 41 made of ITO having a thickness of 50 μm, for example, is formed on p-type nitride semiconductor layer 4, and irregularities are formed at the surface of second transparent conductor 41. Here, the irregularities at the surface of second transparent conductor 41 can be formed by removing second transparent conductor 41 in a pattern of dots, for example, each having a diameter of 2 μm and a height of 2 μm.

Figure 16:
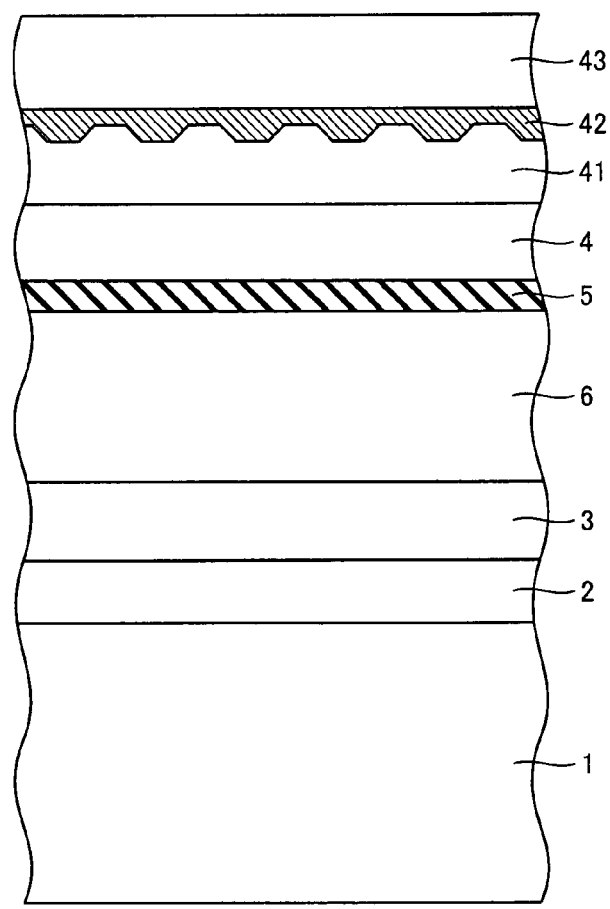

Next, as shown in a schematic cross-sectional view in FIG. 16, metal layer 42 made of an aluminum (Al) film having a thickness of 200 nm, for example, and first transparent conductor 43 made of ITO having a thickness of 50 μm, for example, are stacked in this order by, for example, an evaporation method or the like.

Here, second transparent conductor 41 is preferably heated to a temperature of not less than 500° C. and not more than 800° C., and more preferably a temperature of not less than 500° C. and not more than 650° C., in order to improve transmittance and reduce resistivity for serving as a transparent conductor. Furthermore, from a viewpoint of allowing the transparent conductor to further exhibit its function, second transparent conductor 41 is preferably heated to the above-described temperature (preferably not less than 500° C. and not more than 800° C., more preferably not less than 500° C. and not more than 650° C.), for not less than 10 minutes and not more than 60 minutes, and more preferably for not less than 10 minutes and not more than 30 minutes.

Figure 17:
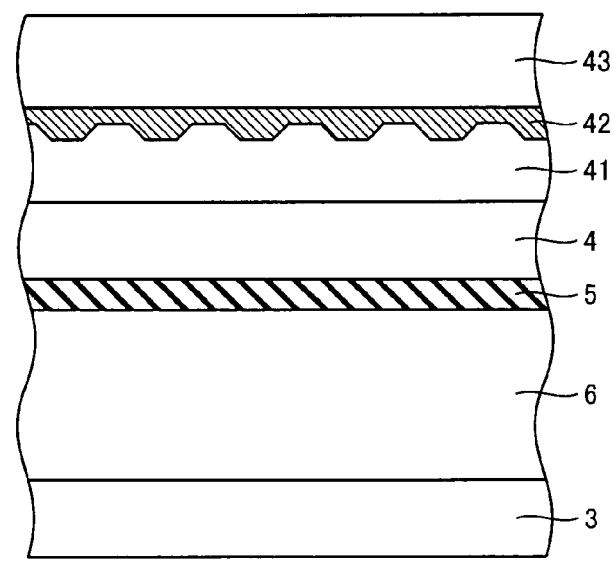

YAG-THG laser light (wavelength of 355 nm) is subsequently applied from the rear surface-side of sapphire substrate 1, the rear surface being mirror-polished, so that sapphire substrate 1, buffer layer 2, and a part of undoped nitride semiconductor layer 3 are thermally decomposed to remove sapphire substrate 1 and buffer layer 2 as shown in a schematic cross-sectional view in FIG. 17.

Figure 18:
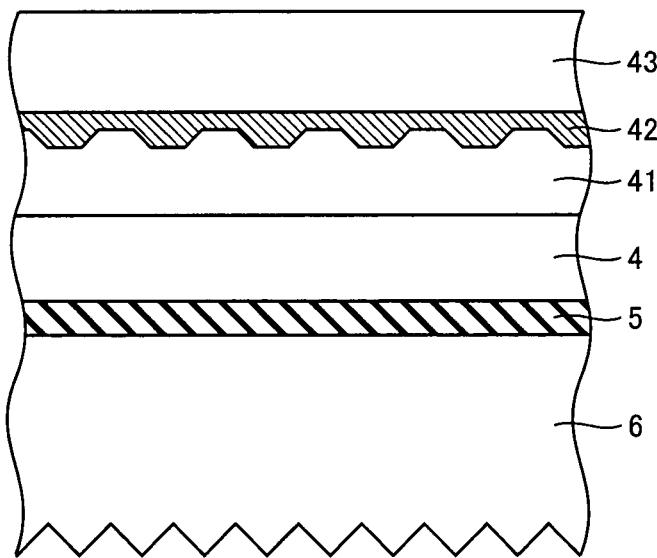

Undoped nitride semiconductor layer 3 is then ground to expose the surface of n-type nitride semiconductor layer 6. As shown in a schematic cross-sectional view in FIG. 18, irregularities are formed at the surface of n-type nitride semiconductor layer 6 by RIE or the like.

Figure 19:
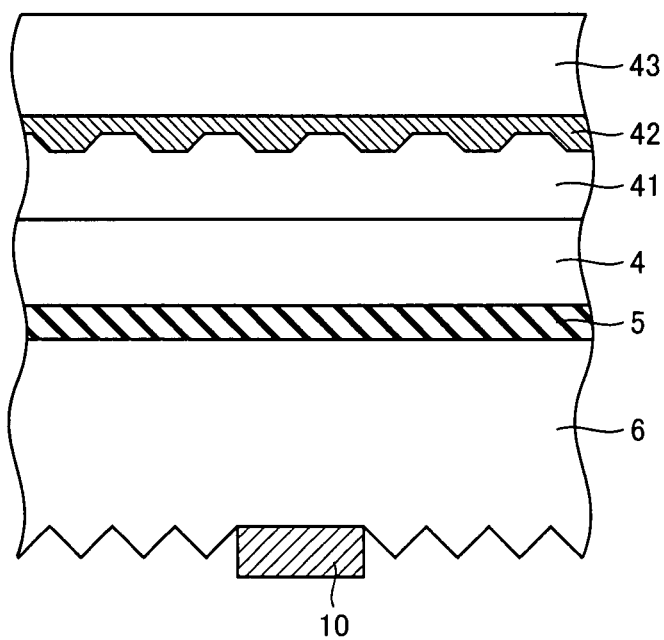

Next, as shown in a schematic cross-sectional view in FIG. 19, n-side bonding pad electrode 10 is formed at a part of the surface of n-type nitride semiconductor layer 6 by stacking a Ti layer and an Au layer suitable for serving as a bonding pad, in this order on the surface of n-type nitride semiconductor layer 6 by, for example, an evaporation method or the like. An Au wire (not shown) is then ball-bonded onto n-side bonding pad electrode 10.

Figure 20:
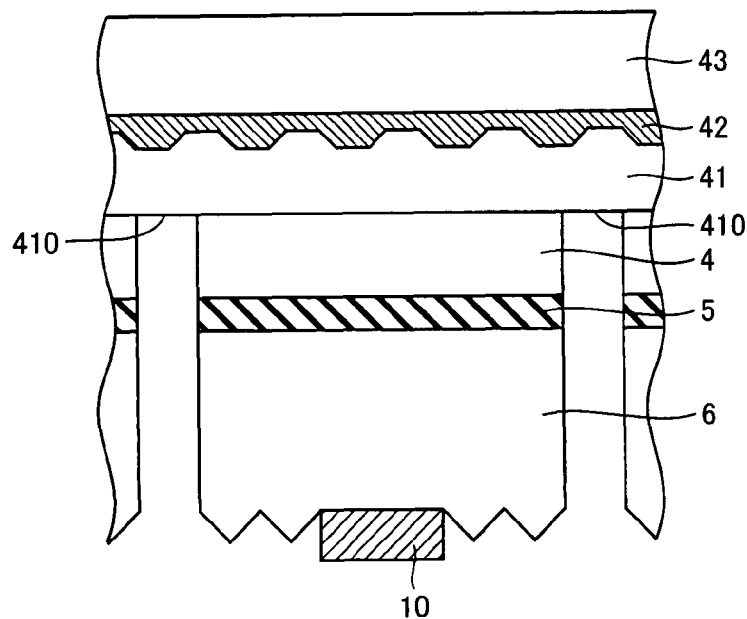
Figure 21:
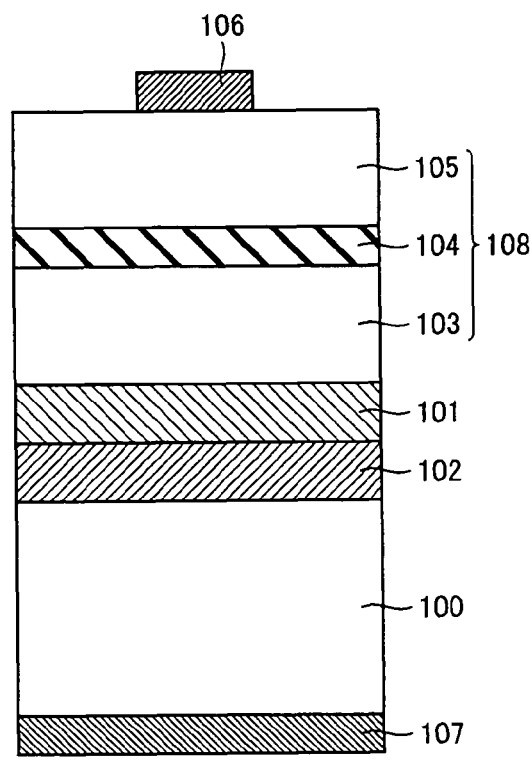
FIG. 21 is a schematic cross-sectional view of an example of a conventional nitride semiconductor light-emitting element having an upper and lower electrode structure.

Successively, as shown in a schematic cross-sectional view in FIG. 20, a part of each of p-type nitride semiconductor layer 4, light-emitting layer 5, and n-type nitride semiconductor layer 6 is etched by RIE or the like to expose a part of the surface of second transparent conductor 41. Accordingly, exposed surface 410 is formed.

The etched wafer as described above is divided into a plurality of chips, so that there is obtained a nitride semiconductor light-emitting element according to the present invention as shown in FIG. 14. The nitride semiconductor light-emitting element obtained as such is packaged such that a surface thereof on the first transparent conductor 43-side serves as a mounting surface to be mounted on a mounting member.

As described above, in the present embodiment as well, the stacked body of first transparent conductor 43 made of ITO, metal layer 42 made of an Ag—Nd film, and second transparent conductor 41 made of ITO performs both of a function of a supporting substrate for removing the sapphire substrate, and a function of a conductive substrate for forming an upper and lower electrode structure. Accordingly, in the present embodiment as well, junction by thermocompression bonding is not required for forming the upper and lower electrode structure, and it is possible to significantly reduce conventional peeling, warpage of the substrate caused by thermocompression bonding, and others, so that manufacturing yield and reliability of the nitride semiconductor light-emitting element can be improved. Furthermore, in the present embodiment as well, it is also possible to effectively prevent increase in operating voltage of the nitride semiconductor light-emitting element, which increase is attributable to peeling.

Furthermore, in the nitride semiconductor light-emitting element according to the present embodiment as well, metal layer 42 between first transparent conductor 43 and second transparent conductor 41 has a function of a reflective layer that reflects at least a part of light emitted from the light-emitting layer, so that more light can be extracted than in the nitride semiconductor light-emitting element in the first embodiment.

Furthermore, in the nitride semiconductor light-emitting element according to the present embodiment, there is formed metal layer 42 having a surface with irregularities between the surface of first transparent conductor 43 and the surface of second transparent conductor 41, so that an area where light is reflected by metal layer 42 is more increased than in the configuration of the second embodiment, and that light incident on a surface of the irregularities at metal layer 42 is diffusely reflected, which makes it possible to efficiently extract the light externally. Accordingly, more light can be extracted than in the nitride semiconductor light-emitting element in the second embodiment.

Accordingly, the nitride semiconductor light-emitting element according to the present embodiment is superior in external extraction efficiency of light, and hence can serve as a nitride semiconductor light-emitting element having favorable reliability.

Furthermore, in the nitride semiconductor light-emitting element according to the present embodiment, formation of exposed surface 410 makes it possible to easily divide the etched wafer when the wafer is divided into a plurality of chips.

Furthermore, in the nitride semiconductor light-emitting element according to the present embodiment, there is no need to divide a pn junction when the wafer is divided into chips, so that a short circuit is less likely to occur.

Furthermore, in the nitride semiconductor light-emitting element according to the present embodiment, chipping, cracking, and peeling of the nitride semiconductor layer (p-type nitride semiconductor layer 4, light-emitting layer 5, and n-type nitride semiconductor layer 6) on second transparent conductor 41 are also reduced, so that reliability of the nitride semiconductor light-emitting element is improved, and illumination failure of the nitride semiconductor light-emitting element can be reduced.

Furthermore, in the nitride semiconductor light-emitting element according to the present embodiment, two transparent conductors, namely, first transparent conductor 43 and second transparent conductor 41 are used as transparent conductors, so that it is possible to form a transparent conductor having a large film thickness.

In the present embodiment as well, the stacked body of first transparent conductor 43, metal layer 42, and second transparent conductor 41 is preferably formed to have a total thickness of not less than 40 μm and not more than 400 μm, and more preferably a total thickness of not less than 50 μm and not more than 120 μm. If the stacked body is formed to have a total thickness of not less than 40 μm and not more than 400 μm, and particularly a thickness of not less than 50 μm and not more than 120 μm, the stacked body tends to more efficiently perform both of the function of the supporting substrate for removing the sapphire substrate, and the function of the conductive substrate for forming the upper and lower electrode structure.

Fourth Embodiment

Figure 22:
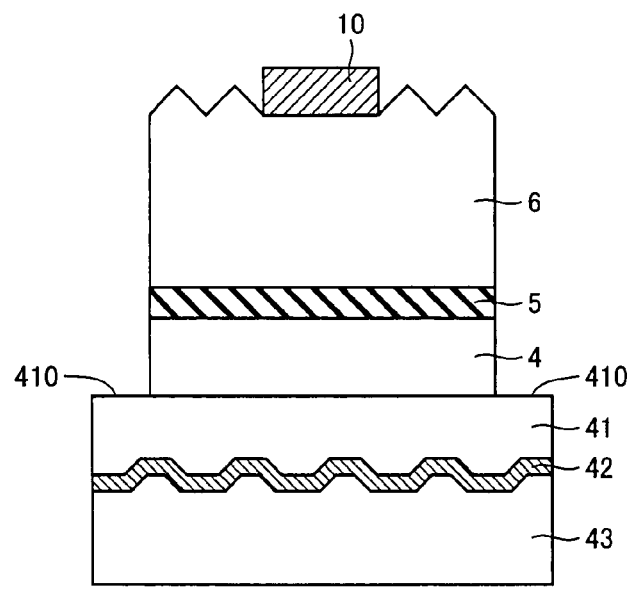
FIG. 22 is a schematic cross-sectional view of a further preferable example of the nitride semiconductor light-emitting element according to the present invention.

FIG. 22 is a schematic cross-sectional view of a further preferable example of the nitride semiconductor light-emitting element according to the present invention. The nitride semiconductor light-emitting element is configured such that metal layer 42, second transparent conductor 41, Mg-doped p-type nitride semiconductor layer 4, light-emitting layer 5 having an MQW structure made of a nitride semiconductor, Si-doped n-type nitride semiconductor layer 6, and n-side bonding pad electrode 10 made of a stacked body of a Ti layer and an Au layer, are stacked in this order on first transparent conductor 43 made of ITO. Furthermore, irregularities are formed at the surface of n-type nitride semiconductor layer 6, at the surface of second transparent conductor 41 on the metal layer 42-side, and at a surface of first transparent conductor 43 on the metal layer 42-side. Furthermore, the nitride semiconductor light-emitting element has exposed surface 410 where an outer peripheral portion of the surface of second transparent conductor 41 on the nitride semiconductor layer (here, p-type nitride semiconductor layer 4, light-emitting layer 5, and n-type nitride semiconductor layer 6)-side is exposed. Accordingly, p-type nitride semiconductor layer 4, light-emitting layer 5, and n-type nitride semiconductor layer 6 are located on the surface of second transparent conductor 41 inside a region surrounded by exposed surface 410.

A preferable example of a method of manufacturing the nitride semiconductor light-emitting element shown in FIG. 22 will hereinafter be descried. Initially, as shown in FIG. 2, buffer layer 2 made of GaN, undoped nitride semiconductor layer 3, n-type nitride semiconductor layer 6, light-emitting layer 5, and p-type nitride semiconductor layer 4 are grown in this order on sapphire substrate 1 by, for example, an MOCVD method. This procedure thus far is similar to that of the first to third embodiments.

Next, as shown in a schematic cross-sectional view in FIG. 15, second transparent conductor 41 made of ITO having a thickness of 50 μm, for example, is formed on p-type nitride semiconductor layer 4, and irregularities are formed at the surface of second transparent conductor 41. Here, the irregularities at the surface of second transparent conductor 41 can be formed by removing second transparent conductor 41 in a pattern of dots, for example, each having a diameter of 2 μm and a height of 2 μm.

Figure 23:
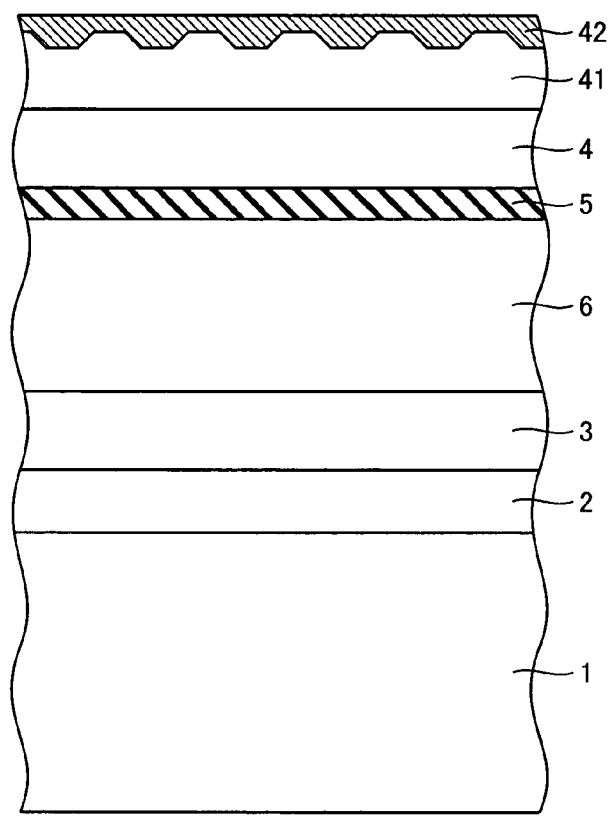
FIGS. 23-29 are schematic cross-sectional views each showing a part of a manufacturing process in a method of manufacturing the nitride semiconductor light-emitting element according to the present invention shown in FIG. 22.

Next, as shown in a schematic cross-sectional view in FIG. 23, metal layer 42 made of an aluminum (Al) film having a thickness of 200 μm, for example, is stacked on the surface of second transparent conductor 41 by, for example, an evaporation method or the like.

Figure 24:
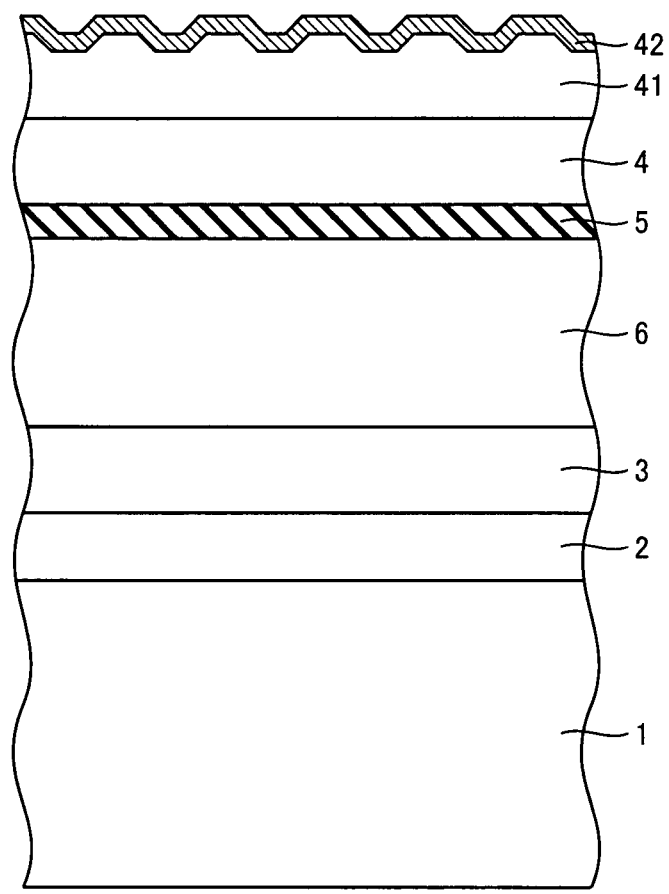

Next, as shown in a schematic cross-sectional view in FIG. 24, irregularities are formed at the surface of metal layer 42 by removing a part of the surface of metal layer 42 through etching or the like. Here, the irregularities at the surface of metal layer 42 can be formed by removing metal layer 42 in a pattern of dots, for example, each having a diameter of 2 μm and a height of 2 μm.

Figure 25:
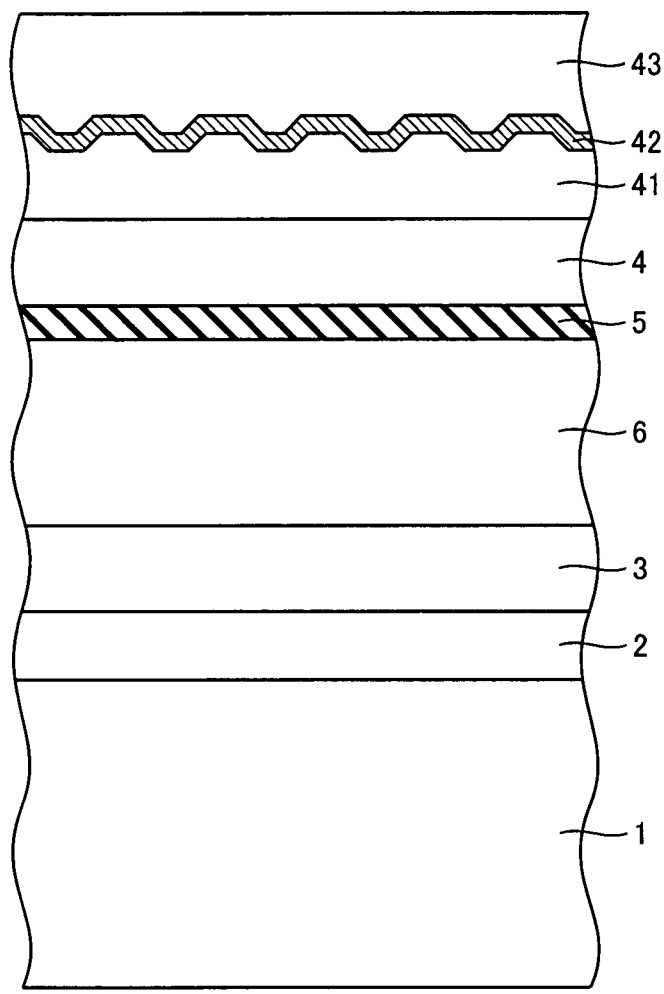

Next, as shown in a schematic cross-sectional view in FIG. 25, first transparent conductor 43 made of ITO having a thickness of 50 μm, for example, is stacked by, for example, an evaporation method or the like.

Here, second transparent conductor 41 is preferably heated to a temperature of not less than 500° C. and not more than 800° C., and more preferably a temperature of not less than 500° C. and not more than 650° C., in order to improve transmittance and reduce resistivity for serving as a transparent conductor. Furthermore, from a viewpoint of allowing the transparent conductor to further exhibit its function, second transparent conductor 41 is preferably heated to the above-described temperature (preferably not less than 500° C. and not more than 800° C., more preferably not less than 500° C. and not more than 650° C.), for not less than 10 minutes and not more than 60 minutes, and more preferably for not less than 10 minutes and not more than 30 minutes.

Figure 26:
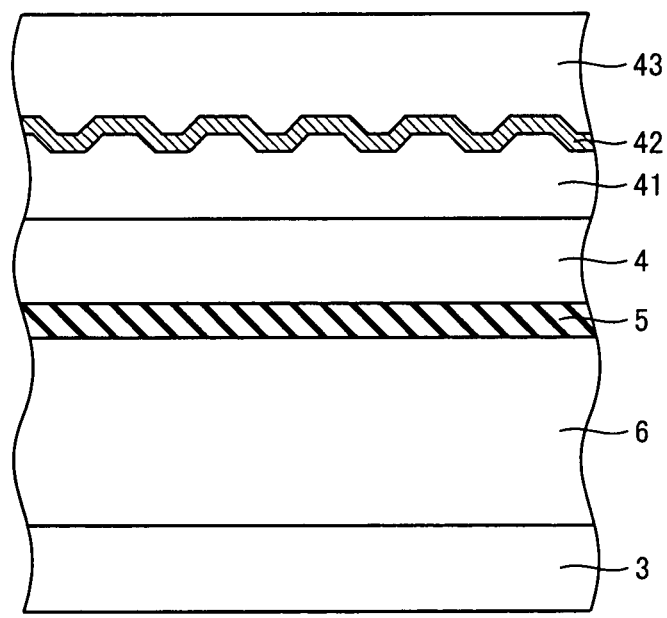

YAG-THG laser light (wavelength of 355 nm) is subsequently applied from the rear surface-side of sapphire substrate 1, the rear surface being mirror-polished, so that sapphire substrate 1, buffer layer 2, and a part of undoped nitride semiconductor layer 3 are thermally decomposed to remove sapphire substrate 1 and buffer layer 2 as shown in a schematic cross-sectional view in FIG. 26.

Figure 27:
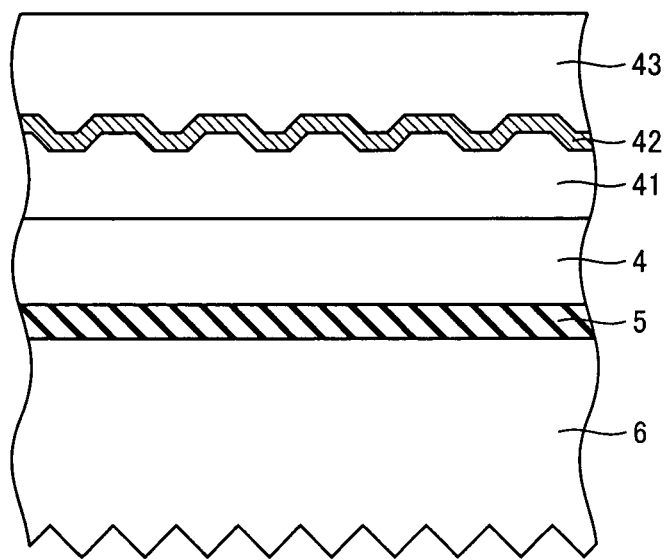

Undoped nitride semiconductor layer 3 is then ground to expose a surface of n-type nitride semiconductor layer 6. As shown in a schematic cross-sectional view in FIG. 27, irregularities are formed at the surface of n-type nitride semiconductor layer 6 by RIE or the like.

Figure 28:
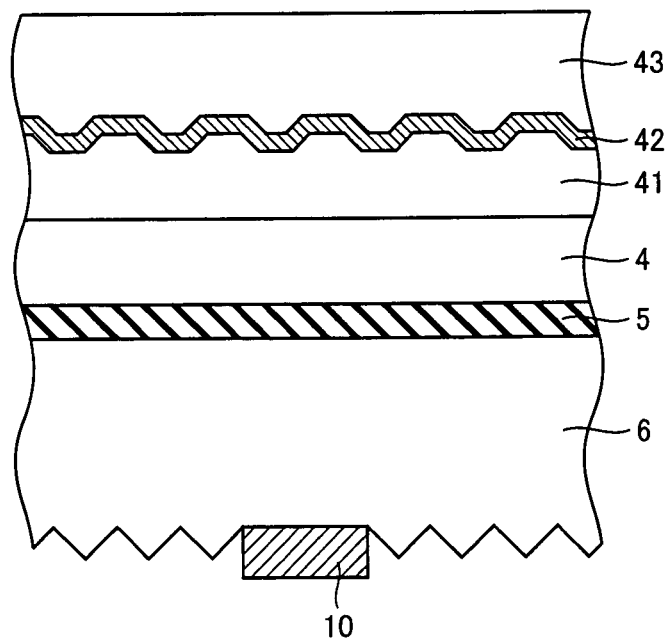

Next, as shown in a schematic cross-sectional view in FIG. 28, n-side bonding pad electrode 10 is formed at a part of the surface of n-type nitride semiconductor layer 6 by stacking a Ti layer and an Au layer suitable for serving as a bonding pad, in this order on the surface of n-type nitride semiconductor layer 6 by, for example, an evaporation method or the like. An Au wire (not shown) is then ball-bonded onto n-side bonding pad electrode 10.

Figure 29:
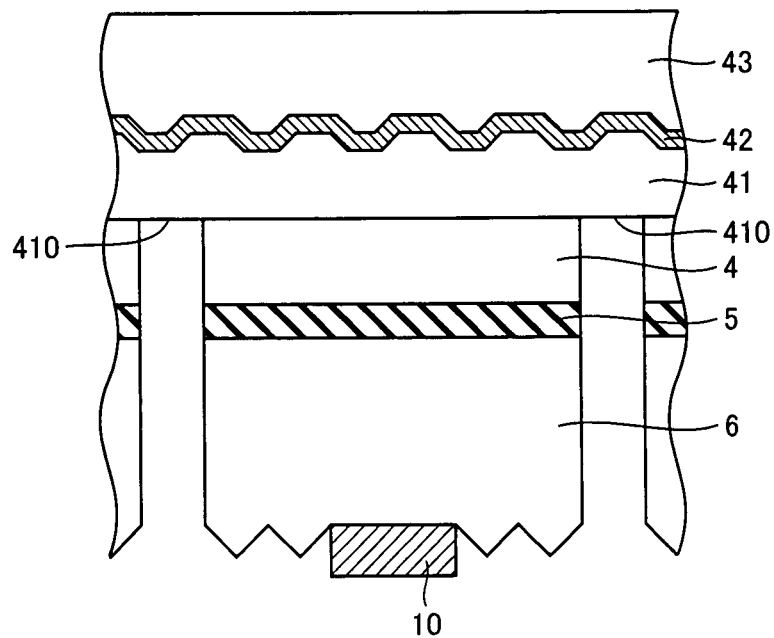

Successively, as shown in a schematic cross-sectional view in FIG. 29, a part of each of p-type nitride semiconductor layer 4, light-emitting layer 5, and n-type nitride semiconductor layer 6 is etched by RIE or the like to expose a part of the surface of second transparent conductor 41. Accordingly, exposed surface 410 is formed.

The etched wafer as described above is divided into a plurality of chips, so that there is obtained a nitride semiconductor light-emitting element according to the present invention as shown in FIG. 22. The nitride semiconductor light-emitting element obtained as such is packaged such that a surface thereof on the first transparent conductor 43-side serves as a mounting surface to be mounted on a mounting member.

As described above, in the present embodiment as well, the stacked body of first transparent conductor 43 made of ITO, metal layer 42 made of an Ag—Nd film, and second transparent conductor 41 made of ITO performs both of a function of a supporting substrate for removing the sapphire substrate, and a function of a conductive substrate for forming an upper and lower electrode structure. Accordingly, in the present embodiment as well, junction by thermocompression bonding is not required for forming the upper and lower electrode structure, and it is possible to significantly reduce conventional peeling, warpage of the substrate caused by thermocompression bonding, and others, so that manufacturing yield and reliability of the nitride semiconductor light-emitting element can be improved. Furthermore, in the present embodiment as well, it is also possible to effectively prevent increase in operating voltage of the nitride semiconductor light-emitting element, which increase is attributable to peeling.

Furthermore, in the nitride semiconductor light-emitting element according to the present embodiment as well, metal layer 42 between first transparent conductor 43 and second transparent conductor 41 has a function of a reflective layer that reflects at least a part of light emitted from the light-emitting layer, so that more light can be extracted than in the nitride semiconductor light-emitting element in the first embodiment.

Furthermore, in the nitride semiconductor light-emitting element according to the present embodiment, there is formed metal layer 42 having surfaces with irregularities between the surface of first transparent conductor 43 and the surface of second transparent conductor 41, so that an area where light is reflected by metal layer 42 is more increased than in the configuration of the second embodiment, and that light incident on a surface of the irregularities at metal layer 42 is diffusely reflected, which makes it possible to efficiently extract the light externally. Accordingly, more light can be extracted than in the nitride semiconductor light-emitting element in the second embodiment.

Accordingly, the nitride semiconductor light-emitting element according to the present embodiment is superior in external extraction efficiency of light, and hence can serve as a nitride semiconductor light-emitting element having favorable reliability.

Furthermore, in the nitride semiconductor light-emitting element according to the present embodiment, formation of exposed surface 410 makes it possible to easily divide the etched wafer when the wafer is divided into a plurality of chips.

Furthermore, in the nitride semiconductor light-emitting element according to the present embodiment, there is no need to divide a pn junction when the wafer is divided into chips, so that a short circuit is less likely to occur.

Furthermore, in the nitride semiconductor light-emitting element according to the present embodiment, chipping, cracking, and peeling of the nitride semiconductor layer (p-type nitride semiconductor layer 4, light-emitting layer 5, and n-type nitride semiconductor layer 6) on second transparent conductor 41 are also reduced, so that reliability of the nitride semiconductor light-emitting element is improved, and illumination failure of the nitride semiconductor light-emitting element can be reduced.

Furthermore, in the nitride semiconductor light-emitting element according to the present embodiment, two transparent conductors, namely, first transparent conductor 43 and second transparent conductor 41 are used as transparent conductors, so that it is possible to form a transparent conductor having a large film thickness.

In the present embodiment as well, the stacked body of first transparent conductor 43, metal layer 42, and second transparent conductor 41 is preferably formed to have a total thickness of not less than 40 μm and not more than 400 μm, and more preferably a total thickness of not less than 50 μm and not more than 120 μm. If the stacked body is formed to have a total thickness of not less than 40 μm and not more than 400 μm, and particularly a thickness of not less than 50 μm and not more than 120 μm, the stacked body tends to more efficiently perform both of the function of the supporting substrate for removing the sapphire substrate, and the function of the conductive substrate for forming the upper and lower electrode structure.

Others

In the first embodiment described above, there is explained the case where ITO is used as a material of transparent conductor 40. As to the material of transparent conductor 40 in the present invention, it is preferable to use ITO, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride. It is more preferable to use ITO or zinc oxide.

In the second to fourth embodiments described above, there is explained the case where ITO is used as a material of first transparent conductor 43 and second transparent conductor 41. As to the material of first transparent conductor 43 and/or second transparent conductor 41 in the present invention, it is preferable to use ITO, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride. It is more preferable to use ITO or zinc oxide.

In other words, it is preferable to use ITO, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride, as a material of transparent conductor 40, first transparent conductor 43, and second transparent conductor 41, because these transparent conductors become superior in electrical conductivity, optical transparency, strength, and others. In particular, if ITO or zinc oxide is used as a material of transparent conductor 40, first transparent conductor 43, and second transparent conductor 41, there is a tendency that a temperature at which ITO or zinc oxide is formed can further be lowered, and that resistivity can also be reduced. In particular, if each of transparent conductor 40, first transparent conductor 43, and second transparent conductor 41 is made of zinc oxide, these transparent conductors can be formed by an electroless plating method, and hence manufacturing thereof tends to be facilitated.

For ITO used as a material of transparent conductor 40, first transparent conductor 43, and second transparent conductor 41, amorphous ITO may be used. If amorphous ITO is used as a material of transparent conductor 40, first transparent conductor 43, and second transparent conductor 41, a pattern can be made more clearly. For example, if irregularities are to be formed at the surface(s) of metal layer 42 as shown in FIGS. 14 and 22, there is a tendency that the irregularities at metal layer 42 can be formed more accurately at the surface of second transparent conductor 41 in a manufacturing step shown in, for example, FIG. 15.

Furthermore, it is preferable in the present invention to form irregularities at the surface of n-type nitride semiconductor layer 6 opposite to light-emitting layer 5, as in the first to fourth embodiments described above. In this case, it is possible to improve external extraction efficiency of light emitted from light-emitting layer 5. In the first to fourth embodiments described above, p-type nitride semiconductor layer 4 is described as the first conductivity-type nitride semiconductor layer, while n-type nitride semiconductor layer 6 is described as the second conductivity-type nitride semiconductor layer. However, in the present invention, n-type nitride semiconductor layer 6 may be the first conductivity-type nitride semiconductor layer, while p-type nitride semiconductor layer 4 may be the second conductivity-type nitride semiconductor layer, and the positions of n-type nitride semiconductor layer 6 and p-type nitride semiconductor layer 4 may be interchanged with respect to the positions thereof in the first to fourth embodiments described above.

Furthermore, it is preferable in the present invention to form irregularities at the surface of second transparent conductor 41 on the metal layer 42-side and/or at the surface of metal layer 42 on the second transparent conductor 41-side, as in the third and fourth embodiments described above. In this case, light emitted from light-emitting layer 5 is more likely to be reflected at an interface between second transparent conductor 41 and metal layer 42, so that it is possible to improve external extraction efficiency of light emitted from light-emitting layer 5. Furthermore, it is preferable that the irregularities formed at the surface of second transparent conductor 41 on the metal layer 42-side and/or at the surface of metal layer 42 on the second transparent conductor 41-side are in the form of dimple. In this case, light emitted from light-emitting layer 5 is much more likely to be reflected at the interface between second transparent conductor 41 and metal layer 42, and hence there is a tendency that external extraction efficiency of light emitted from light-emitting layer 5 can further be improved.

In the second embodiment described above, there is explained the case where Ag—Nd identified as an Ag alloy is used as a material of metal layer 42. In the third and fourth embodiments described above, there is explained the case where Al is used as a material of metal layer 42. In the present invention, metal layer 42 preferably includes at least one selected from the group consisting of a metal adhesive layer, a metal barrier layer, and a metal reflective layer. In this case, metal layer 42 exhibits at least one function selected from the group consisting of a function of a metal adhesive layer (a function of being able to further suppress peeling of layers from each other located with the metal adhesive layer interposed therebetween, when compared with the case where no metal adhesive layer is formed), a function of a metal barrier layer (a function of being able to further suppress migration of atoms between the layers located with the metal barrier layer interposed therebetween, when compared with the case where no metal barrier layer is formed), and a function of a metal reflective layer (a function of reflecting at least a part of light from the light-emitting layer). Accordingly, there is a tendency that manufacturing yield and reliability, as well as properties such as external extraction efficiency of light, of the nitride semiconductor light-emitting element according to the present invention are improved.

Here, from a viewpoint of improving the function of the metal adhesive layer, chromium or a chromium alloy may preferably be used as a material of the metal adhesive layer. From a viewpoint of improving the function of the metal barrier layer, nickel, titanium, a nickel-titanium alloy, or platinum may preferably be used as a material of the metal barrier layer. Furthermore, from a viewpoint of improving the function of the metal reflective layer, it is preferable to use at least one selected from the group consisting of silver, platinum, aluminum, rhodium, a silver-neodymium alloy, a silver-neodymium-copper alloy, a silver-palladium alloy, a silver-palladium-copper alloy, a silver-bismuth alloy, and a silver-neodymium-gold alloy, as a material of the metal reflective layer.

In the first to fourth embodiments described above, the surface of the nitride semiconductor light-emitting element on the transparent conductor 40-side, or the surface thereof on the first transparent conductor 43-side, is made to serve as a mounting surface to be mounted on a mounting member. On the mounting surface described above, a metal film such as a stacked body of chromium and gold may be formed.

In the first to fourth embodiments described above, a sapphire substrate is used as a substrate for growing thereon a nitride semiconductor layer. As to the substrate for growing thereon a nitride semiconductor layer in the present invention, it is preferable to use, from a viewpoint of reducing a lattice constant difference between the substrate and a nitride semiconductor crystal that forms the nitride semiconductor layer, a substrate made of at least one type of semiconductor crystal selected from a group consisting of sapphire, gallium arsenide, gallium phosphide, silicon, and germanium.

In the first to fourth embodiments described above, light-emitting layer 5 is described as a layer having an MQW structure. However, the present invention is not limited thereto, and a light-emitting layer having a Single Quantum Well (SQW) structure may be used.

According to the present invention, it is possible to provide a nitride semiconductor light-emitting element and a method of manufacturing the same, which can improve manufacturing yield and reliability, and hence the nitride semiconductor light-emitting element according to the present invention can suitably be utilized for a blue light-emitting diode that emits blue light having a wavelength of not less than 430 nm and not more than 490 nm, for example, and others.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting element comprising:
   a first transparent conductor;
   a metal layer having a uniform width;
   a second transparent conductor;
   a first conductivity-type nitride semiconductor layer;
   a light-emitting layer; and
   a second conductivity-type nitride semiconductor layer, wherein:

the metal layer, the second transparent conductor, the first conductivity-type nitride semiconductor layer, the light-emitting layer, and the second conductivity-type nitride semiconductor layer are successively stacked on said first transparent conductor, said metal layer is in contact with both a first surface of said first transparent conductor and a second surface of said second transparent conductor, said first conductivity-type nitride semiconductor layer is in contact with a first surface of said second transparent conductor opposite the second surface of said second transparent conductor, said metal layer is a single layer, and said first transparent conductor has an exposed second surface opposite the first surface of said first transparent conductor.

2. The nitride semiconductor light-emitting element according to claim 1, wherein a top surface of said second conductivity-type nitride semiconductor layer has irregularities.

3. The nitride semiconductor light-emitting element according to claim 1, wherein a thickness of said second transparent conductor is smaller than a thickness of said first transparent conductor.

4. The nitride semiconductor light-emitting element according to claim 1, wherein a surface of the nitride semiconductor light-emitting element on a side having said first transparent conductor is made to serve as a mounting surface.

5. The nitride semiconductor light-emitting element according to claim 1, wherein said first conductivity-type nitride semiconductor layer contains at least magnesium, and said second conductivity-type nitride semiconductor layer contains at least silicon.

6. The nitride semiconductor light-emitting element according to claim 1, wherein said first conductivity-type nitride semiconductor layer, said light-emitting layer, and said second conductivity-type nitride semiconductor layer are located on said second transparent conductor inside a region surrounded by an exposed surface obtained by exposing a part of the first surface of said second transparent conductor.

7. The nitride semiconductor light-emitting element according to claim 1, wherein a part of the first surface of said second transparent conductor is exposed so as to surround the periphery of said first conductivity-type nitride semiconductor layer, said light-emitting layer, and said second conductivity-type nitride semiconductor layer.

8. The nitride semiconductor light-emitting element according to claim 1, wherein said first transparent conductor and said second transparent conductor contain indium tin oxide, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride.

9. The nitride semiconductor light-emitting element according to claim 1, wherein said metal layer is one of a metal adhesive layer, a metal barrier layer, and a metal reflective layer.

10. The nitride semiconductor light-emitting element according to claim 9, wherein said metal adhesive layer contains chromium or a chromium alloy.

11. The nitride semiconductor light-emitting element according to claim 9, wherein said metal barrier layer contains nickel, titanium, a nickel-titanium alloy, or platinum.

12. The nitride semiconductor light-emitting element according to claim 9, wherein said metal reflective layer contains at least one selected from the group consisting of silver, platinum, aluminum, rhodium, a silver-neodymium alloy, a silver-neodymium-copper alloy, a silver-palladium alloy, a silver-palladium-copper alloy, a silver-bismuth alloy, and a silver-neodymium-gold alloy.

13. A method of manufacturing the nitride semiconductor light-emitting element, comprising the steps of:

stacking a second conductivity-type nitride semiconductor layer, a light-emitting layer, and a first conductivity-type nitride semiconductor layer containing magnesium on a substrate in this order;

forming a second transparent conductor on said first conductivity-type nitride semiconductor layer, said first conductivity-type nitride semiconductor layer being in contact with a first surface of said second transparent conductor opposite a second surface of said second transparent conductor;

heating said second transparent conductor to a temperature of not less than 500° C. for not less than 10 minutes;

forming a metal layer on said second transparent conductor after said heating, said metal layer having a uniform width; and forming a first transparent conductor on said metal layer, said first transparent conductor having an exposed second surface opposite a first surface of said first transparent conductor, said metal layer being in contact with both the first surface of said first transparent conductor and the second surface of said transparent conductor, said metal layer being a single layer.

14. The method of manufacturing the nitride semiconductor light-emitting element according to claim 13, wherein at least one of said first transparent conductor and said second transparent conductor contains indium tin oxide, zinc oxide, tin oxide, cadmium oxide, cadmium indium oxide, cadmium tin oxide, zinc tin oxide, indium zinc oxide, magnesium indium oxide, calcium gallium oxide, titanium nitride, zirconium nitride, hafnium nitride, or lanthanum boride.

15. The method of manufacturing the nitride semiconductor light-emitting element according to claim 13, wherein said substrate contains at least one selected from the group consisting of sapphire, gallium arsenide, gallium phosphide, silicon, and germanium.

16. The method of manufacturing the nitride semiconductor light-emitting element according to claim 13, comprising the step of removing said substrate.

17. The method of manufacturing the nitride semiconductor light-emitting element according to claim 13, comprising the step of exposing a part of the first surface of said second transparent conductor by removing portions of said second conductivity-type nitride semiconductor layer, said light-emitting layer, and said first conductivity-type nitride semiconductor layer.

* * * * *